(12) United States Patent
Isobe et al.

(10) Patent No.: US 7,063,598 B2
(45) Date of Patent: Jun. 20, 2006

(54) SUBSTRATE DELIVERY MECHANISM

(75) Inventors: Soichi Isobe, Kanagawa (JP); Hideo Aizawa, Kanagawa (JP); Hiroomi Torii, Kanagawa (JP); Daisuke Koga, Kanagawa (JP); Satoshi Wakabayashi, Kanagawa (JP)

(73) Assignee: Ebara Corporation, Tokyo (JP)

( * ) Notice: Subject to any disclaimer, the term of this patent is extended or adjusted under 35 U.S.C. 154(b) by 146 days.

(21) Appl. No.: 10/397,872

(22) Filed: Mar. 27, 2003

(65) Prior Publication Data

US 2003/0211812 A1    Nov. 13, 2003

(30) Foreign Application Priority Data

Mar. 29, 2002 (JP) .............................. 2002/096437
Jun. 25, 2002  (JP) .............................. 2002/185212

(51) Int. Cl.
*B24B 7/22* (2006.01)

(52) U.S. Cl. ............................ 451/54; 451/41; 451/56; 451/285; 451/443

(58) Field of Classification Search ................ 451/41, 451/54, 56, 66, 67, 73, 285–290, 443, 444
See application file for complete search history.

(56) References Cited

U.S. PATENT DOCUMENTS 5,050,884 A * 9/1991 Flory .......................... 473/282
5,888,124 A * 3/1999 Lin et al. ...................... 451/67
6,086,454 A * 7/2000 Watanabe et al. ............. 451/36

* cited by examiner

*Primary Examiner*—Lee D. Wilson
*Assistant Examiner*—Anthony Ojini
(74) *Attorney, Agent, or Firm*—Wenderoth, Lind, & Ponack, L.L.P.

(57) ABSTRACT

A substrate delivery mechanism comprises a top ring, a substrate loader for loading a substrate, and a pusher mechanism, wherein the substrate loader comprises a top ring guide and the pusher mechanism comprises a top ring guide lifting table, in which the top ring guide and the top ring guide lifting table together form a sealed space below the substrate held by the top ring in a condition where the substrate loader is moved up by the pusher mechanism, wherein the substrate is detached from the top ring by exhausting the sealed space while at the same time injecting a fluid from through-holes provided in a substrate holding surface of the top ring.

22 Claims, 25 Drawing Sheets

SUBSTRATE DELIVERY MECHANISM

BACKGROUND OF THE INVENTION

The present invention relates to a substrate delivery method for transferring or receiving a substrate to or from a substrate holder mechanism (a top ring) serving to hold the substrate to perform a polishing operation in a substrate polishing apparatus for polishing a substrate such as a semiconductor wafer, and relates also to a substrate delivery mechanism for transferring or receiving the substrate to or from the top ring as well as a substrate polishing apparatus comprising the substrate delivery mechanism.

This type of substrate delivery mechanism according to a prior art typically comprises a pusher mechanism for transferring or receiving a substrate to or from a top ring, in which when the pusher mechanism is to receive the substrate from the top ring, a gas (including air and the like) or a liquid (including purified water and the like) or any mixture thereof is injected from a substrate holding surface of the top ring, so that the substrate may detach from the substrate holding surface and drop onto a substrate retaining section of the pusher mechanism disposed thereunder. In such a method allowing for fluid to be injected from the substrate holding surface of the top ring, however, if the substrate holding surface of the top ring is firmly sticking to the substrate, the fluid from the substrate holding surface must be injected for a longer period sufficient to detach the substrate therefrom, leading to a lower throughput of the substrate in the apparatus.

FIGS. 1(a) and 1(b) show an exemplary configuration for the substrate delivery mechanism in the prior art, wherein FIG. 1(a) shows a mode immediately before a substrate is transferred to a substrate tray of a pusher mechanism. FIG. 1(b) shows a mode of a substrate which has dropped into a substrate tray of a pusher mechanism. In FIGS. 1(a) and 1(b), reference numeral 101 designates a top ring having a plurality of through-holes 106 formed in a substrate holding surface 104, the plurality of through-holes 106 being in communication with a chamber 107 which is connected to a pressurizing/exhausting source (though not shown) for supplying/exhausting a gas, a liquid or a mixture thereof to/from the chamber via a pipe 108.

Reference numeral 102 designates a pusher mechanism, which comprises a main shaft 110 by which a ring-like top ring guide 109 is supported via a centering mechanism 111 and a spring 112. Reference numeral 105 designates a ring-like substrate tray disposed on an inner side of the top ring guide 109 and the substrate tray 105 is adapted to be lifted-up by a substrate lifting table 113 supported on a top end of the main shaft 110. When the main shaft 110 is lifted-up by a cylinder, though not shown, the top ring guide 109 is, as shown in FIG. 1(a) and FIG. 1(b), brought into contact with an outer periphery and an under surface of the top ring 101. Under this condition, there is a clearance "a" provided between the substrate holding surface 104 of the top ring 101 and a substrate carrier surface of the substrate tray 105.

To transfer a substrate "Wf", held on the substrate holding surface 104 of the top ring 101, onto the substrate tray 105, starting from the mode shown in FIG. 1(a), a fluid (a gas, a liquid or a mixture thereof) 114 is injected from the plurality of through-holes 106 formed in the substrate holding surface 104 by supplying the fluid 114 to the chamber 107 of the top ring 101 from the pressurizing/exhausting source (not shown) through the pipe 108 to thereby detach the substrate Wf from the substrate holding surface 104 so as to be dropped into the substrate tray 105, as shown in the mode of FIG. 1(b). On the other hand, when the wafer Wf is to be held by the top ring 101, starting from the mode shown in FIG. 1(b), the main shaft 110 of the pusher mechanism 102 is moved up such that the substrate tray 105 may be lifted up by a distance equivalent to the clearance "a" to bring the substrate Wf carried thereon into contact with the substrate holding surface 104 of the top ring 101, and then the chamber 107 is exhausted by the pressurizing/exhausting source via the pipe 108 so as to vacuum-chuck the substrate Wf onto the substrate holding surface 104.

Although a number of times as well as a period of injection of the fluid 114 can be set arbitrarily for detaching the substrate WF from the top ring 101, which has been held thereby, the substrate Wf may occasionally adhere tightly to the substrate holding surface 104 depending on a polishing condition of the wafer and/or characteristics of the top ring 101. Especially, in a case of employing an elastic member made of rubber or the like on the substrate holding surface 104, the substrate is more likely to stick to that elastic member. In this case, in order to transfer the substrate Wf from the top ring 101 to the substrate tray 105 in a stable manner, a longer period of injection of the fluid 114 may be required. This may problematically increase substrate transfer time, which will be one factor in decreasing a processing rate in the apparatus.

SUMMARY OF THE INVENTION

The present invention has been made in the light of the problems as stated above, and an object thereof is to provide a substrate delivery method and a substrate delivery mechanism in which a substrate held by a top ring can be detached and transferred to a subsequent process in a short time, and also to provide a substrate polishing apparatus employing the substrate delivery mechanism.

To solve the above-mentioned problems, the invention according to a first aspect provides a substrate delivery method performed by using a system comprising a substrate holder mechanism having a substrate holder for holding a substrate, and a pusher mechanism having a substrate loader for loading the substrate and an elevator for moving up and down the substrate loader, in which the substrate is transferred and received between the substrate holder of the substrate holder mechanism and the substrate loader of the pusher mechanism. The method is characterized in that when the substrate is to be transferred from the substrate holder of the substrate holder mechanism to the substrate loader of the pusher mechanism, a substrate holder side of the substrate is put under positive pressure, while a substrate loader side of the substrate is put under negative pressure.

According to the method as described above, since when the substrate is to be transferred from the substrate holder of the substrate holder mechanism to the substrate loader of the pusher mechanism, the substrate holder side of the substrate is put under positive pressure (by, for example, injecting a gas, a liquid or a mixture thereof) and the substrate loader side of the substrate is put under negative pressure (by, for example, connecting this region to a vacuum source for evacuation), the substrate can be quickly detached from the substrate holder of the substrate holder mechanism so as to be transferred to the substrate loader of the pusher mechanism by a cooperative action of these positive and negative pressures.

According to a second aspect of the invention, in a substrate delivery method of the first aspect, the negative pressure is established by bringing the substrate loader of the pusher mechanism into contact with the substrate and applying a negative pressure to through-holes formed in a substrate contact surface of the substrate loader.

According to a third aspect of the invention, in a substrate delivery method of the second aspect, after the substrate loader of the pusher mechanism has received the substrate, a positive pressure is applied to through-holes formed in the substrate contact surface of the substrate loader.

As described above, since after the substrate loader has received the substrate, the positive pressure is applied to the through-holes formed in the substrate contact surface of the substrate loader (by, for example, injecting a positively pressurized fluid consisting of a gas, a liquid or any combination thereof), the substrate may be released from its state of being chucked onto the substrate loader by the negative pressure, so that the substrate may be easily detached from the substrate loader.

According to a fourth aspect of the invention, in a substrate delivery method of the first aspect, the negative pressure is established by exhausting a space defined on the substrate loader side of the substrate within the pusher mechanism.

According to a fifth aspect of the invention, in a substrate delivery method of any one of the first to third aspects, before the substrate is held in the substrate holder of the substrate holder mechanism or when the substrate holder side of the substrate is put under positive pressure, a surfactant is sprayed over the substrate contact surface of the substrate holder of the substrate holder mechanism and/or a substrate holder side surface of the substrate.

Since the surfactant is sprayed over the substrate contact surface of the substrate holder and/or the surface of the substrate on the substrate holder side thereof, the substrate having been vacuum-chucked on the substrate holder may be easily detached therefrom.

The invention according to a sixth aspect provides a substrate delivery method performed by using a system comprising a substrate holder mechanism having a substrate holder for holding a substrate, and a pusher mechanism having a substrate loader for loading the substrate and an elevator for moving up and down said substrate loader, in which when the substrate is to be transferred from the substrate holder of the substrate holder mechanism to the substrate loader of the pusher mechanism, a surface of the substrate on a substrate holder side thereof is put under positive pressure to thereby transfer the substrate. The method is characterized in that before the substrate is held in the substrate holder of the substrate holder mechanism or when the surface of the substrate on the substrate holder side thereof is put under positive pressure, a surfactant is sprayed over a substrate contact surface of the substrate holder of the substrate holder mechanism and/or the surface of the substrate on the substrate holder side thereof.

As described above, since the surfactant is sprayed over the substrate contact surface of the substrate holder and/or the surface of the substrate on the substrate holder side thereof, the substrate having been vacuum-chucked on the substrate holder may be easily detached therefrom.

The invention according to a seventh aspect provides a substrate delivery method performed by using a system comprising a substrate holder mechanism having a substrate holder for holding a substrate, and a pusher mechanism having a substrate loader for loading the substrate and an elevator for moving up and down said substrate loader, in which the substrate is transferred and received between the substrate holder of the substrate holder mechanism and the substrate loader of the pusher mechanism. The method is characterized in that a transfer operation of the substrate from the substrate holder of the substrate holder mechanism to the substrate loader of the pusher mechanism is performed under a condition where a sealed space defined below the substrate is exhausted.

As described above, since the transfer operation of the substrate held in the substrate holder to the substrate loader is performed by exhausting the sealed space defined below the substrate, the substrate can be quickly detached from the substrate holder to be transferred to the substrate loader.

The invention according to an eighth aspect provides a substrate delivery mechanism comprising a substrate holder mechanism having a substrate holder for holding a substrate, and a pusher mechanism having a substrate loader for loading the substrate and an elevator for moving up and down the substrate loader, in which the substrate loader is moved up toward the substrate holder of the substrate holder mechanism by the pusher mechanism so as to transfer the substrate held by the substrate holder to the substrate loader. The mechanism is characterized in that the substrate loader comprises a cylindrical substrate holder mechanism guide, and the pusher mechanism comprises a substrate holder mechanism guide lifting table for lifting the substrate holder mechanism guide, wherein the substrate holder mechanism guide and the substrate holder mechanism guide lifting table together define a sealed space below the substrate held by the substrate holder of the substrate holder mechanism in a condition where the substrate loader has been moved up by the pusher mechanism, and additionally an exhaust mechanism is provided for exhausting the sealed space.

According to the configuration as described above, the substrate holder mechanism guide and the substrate holder mechanism guide lifting table form the sealed space below the substrate held by the substrate holder in a condition where the substrate loader has been lifted up by the pusher mechanism, and the exhausting mechanism is additionally provided for exhausting the sealed space. Therefore, when the substrate held on the substrate holder is to be detached therefrom, the substrate can be quickly detached from the substrate holder so as to be transferred to the substrate loader by exhausting this sealed air-tight space to be in a state of negative pressure, thereby creating a lower pressure therein than that above the substrate.

According to a ninth aspect of the invention, in a substrate delivery mechanism of the eighth aspect, the substrate holder mechanism comprises a fluid injection mechanism for injecting a fluid consisting of a gas, a liquid or a mixture thereof to through-holes formed in a substrate contact surface of the substrate holder, wherein a transfer operation of the substrate held by the substrate holder of the substrate holder mechanism to the substrate loader is performed by a cooperative action of the fluid injecting operation of the fluid injection mechanism and an exhausting operation of an exhaust mechanism in a condition where the substrate loader is moved up by the pusher mechanism.

According to the configuration as described above, since the transfer operation of the substrate held by the substrate holder to the substrate loader is performed by the cooperative action of the positive pressure, created by the fluid injection mechanism by injecting the fluid from the through-holes formed in the substrate contact surface of the substrate holder, and the negative pressure created by the exhaust mechanism by exhausting the sealed space defined below the substrate, the substrate can be quickly detached from the substrate holder so as to be transferred onto the substrate loader.

According to a tenth aspect of the invention, in a substrate delivery mechanism of the ninth aspect, the substrate loader comprises a substrate tray housed inside the substrate holder mechanism guide, and the pusher mechanism comprises a substrate tray lifting table for lifting the substrate tray up to the substrate holder mechanism, wherein the transfer operation of the substrate loaded on the substrate tray to the substrate holder mechanism is performed, in a condition where the substrate loader is moved up by the pusher mechanism, by further lifting up the substrate tray with aid of the substrate tray lifting table.

As described above, since the transfer operation of the substrate loaded on the substrate tray to the substrate holder mechanism is performed under a condition where the substrate loader has been moved up by the pusher mechanism and by further lifting up the substrate tray with aid of the substrate tray lifting table, the substrate can be transferred quickly to the substrate holder of the substrate holder mechanism.

The invention according to an eleventh aspect provides a substrate delivery mechanism comprising a substrate holder mechanism having a substrate holder for holding a substrate, and a substrate lifting table capable of being brought into contact with the substrate held in the substrate holder of the substrate holder mechanism, in which through-holes are formed in a substrate contact surface of the substrate lifting table, wherein the substrate is transferred from the substrate holder to the substrate lifting table with cooperation of fluid injection from the substrate holder of the substrate holder mechanism together with vacuum suction by a vacuum source in communication with the through-holes formed in the substrate contact surface of the substrate lifting table.

As described above, the substrate is transferred from the substrate holder to the substrate lifting table with the cooperation of the fluid injection from the substrate holder of the substrate holder mechanism together with the vacuum suction by the vacuum source in communication with the through-holes formed in the substrate contact surface of the substrate lifting table. Therefore, the transfer operation of the substrate from the substrate holder to the substrate lifting table can be performed quickly.

According to a twelfth aspect of the invention, in a substrate delivery mechanism of the eleventh aspect, the through-holes formed in the substrate contact surface of the substrate lifting table are designed to be connectable to, in addition to the vacuum source, a positively pressurized fluid source.

As described above, because the through-holes formed in the substrate contact surface of the substrate lifting table are designed to be connectable to, in addition to the vacuum source, a positively pressurized fluid source, the substrate, once vacuum-chucked, may be released from that vacuum-chucked state easily and completely.

According to a thirteenth aspect of the invention, in a substrate delivery mechanism of any one of the eighth to twelfth aspects, the mechanism further comprises a substrate transfer mechanism. The substrate transfer mechanism comprises a substrate carrier on which the substrate is placed, wherein the substrate carrier is moved horizontally between a substrate delivery position of the substrate delivery mechanism and other transfer mechanisms so as to transfer the substrate.

As described above, since the substrate transfer mechanism is further provided, a transfer operation of the substrate placed on the substrate carrier in the substrate delivery position of the substrate delivery mechanism to the other transfer mechanisms, as well as a transfer operation of the substrate placed on the substrate carrier in the other transfer mechanisms to the substrate delivery position of the substrate delivery mechanism, may be performed easily.

According to a fourteenth aspect of the invention, in a substrate delivery mechanism of any one of the eighth to thirteenth aspects, the mechanism further comprises a nozzle for spraying a surfactant over the substrate contact surface of the substrate holder of the substrate holder mechanism and/or a surface of the substrate on a substrate holder side thereof.

As described above, since the nozzle for spraying the surfactant is further provided so that the surfactant may be sprayed from the nozzle over the substrate contact surface of the substrate holder, before holding the substrate, and/or the surface of the substrate on the substrate holder side thereof, the substrate held by the substrate holder of the substrate holder mechanism can be easily detached therefrom.

The invention according to a fifteenth aspect provides a substrate polishing apparatus comprising a substrate delivery mechanism of any one of the eighth to fourteenth aspects and a polishing table, in which a substrate held in the substrate holder of the substrate holder mechanism is pressed against a polishing surface of the polishing table so as to polish the substrate through a relative motion between the substrate and the polishing surface.

As described above, since the substrate polishing apparatus comprises the substrate delivery mechanism in accordance with any one of the eighth to fourteenth aspects, the substrate can be quickly transferred to or received from the substrate holder of the substrate holder mechanism, thereby improving a polishing process rate in the substrate polishing apparatus.

BRIEF DESCRIPTION OF THE DRAWINGS

FIGS. 1(a) and 1(b) are schematic diagrams showing an exemplary configuration for a substrate delivery mechanism according to a prior art, wherein FIG. 1(a) shows a mode immediately before a substrate is transferred to a substrate tray of a pusher mechanism, and FIG. 1(b) shows a mode after the substrate is dropped into the substrate tray;

FIGS. 11(a) and 11(b) are schematic diagrams showing a region in the vicinity of a transporter in the substrate delivery mechanism according to the present invention, wherein FIG. 11(a) is a top view and FIG. 11(b) is a sectional view taken along line A—A of FIG. 11(a);

Figure 13:
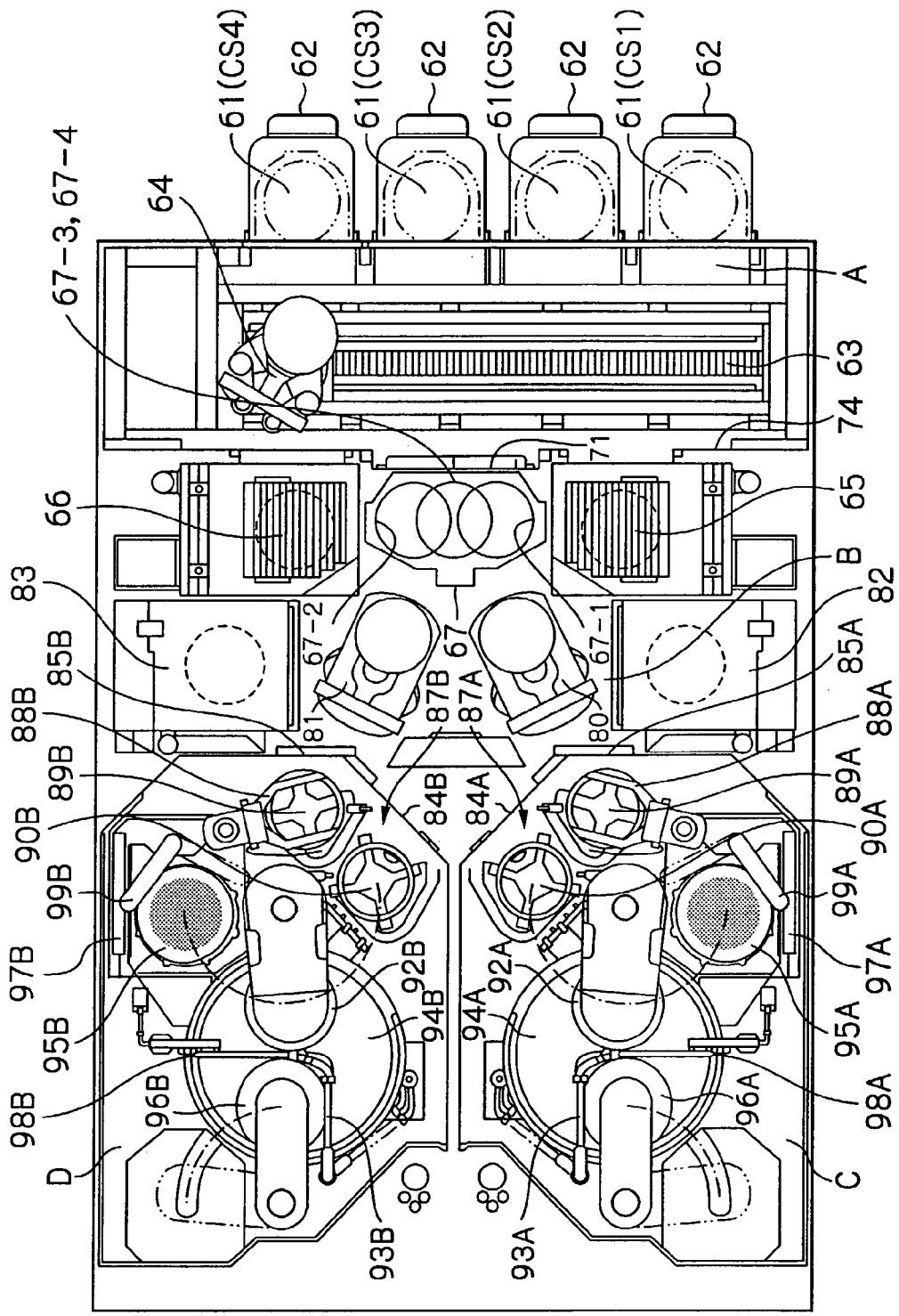
Figure 14:
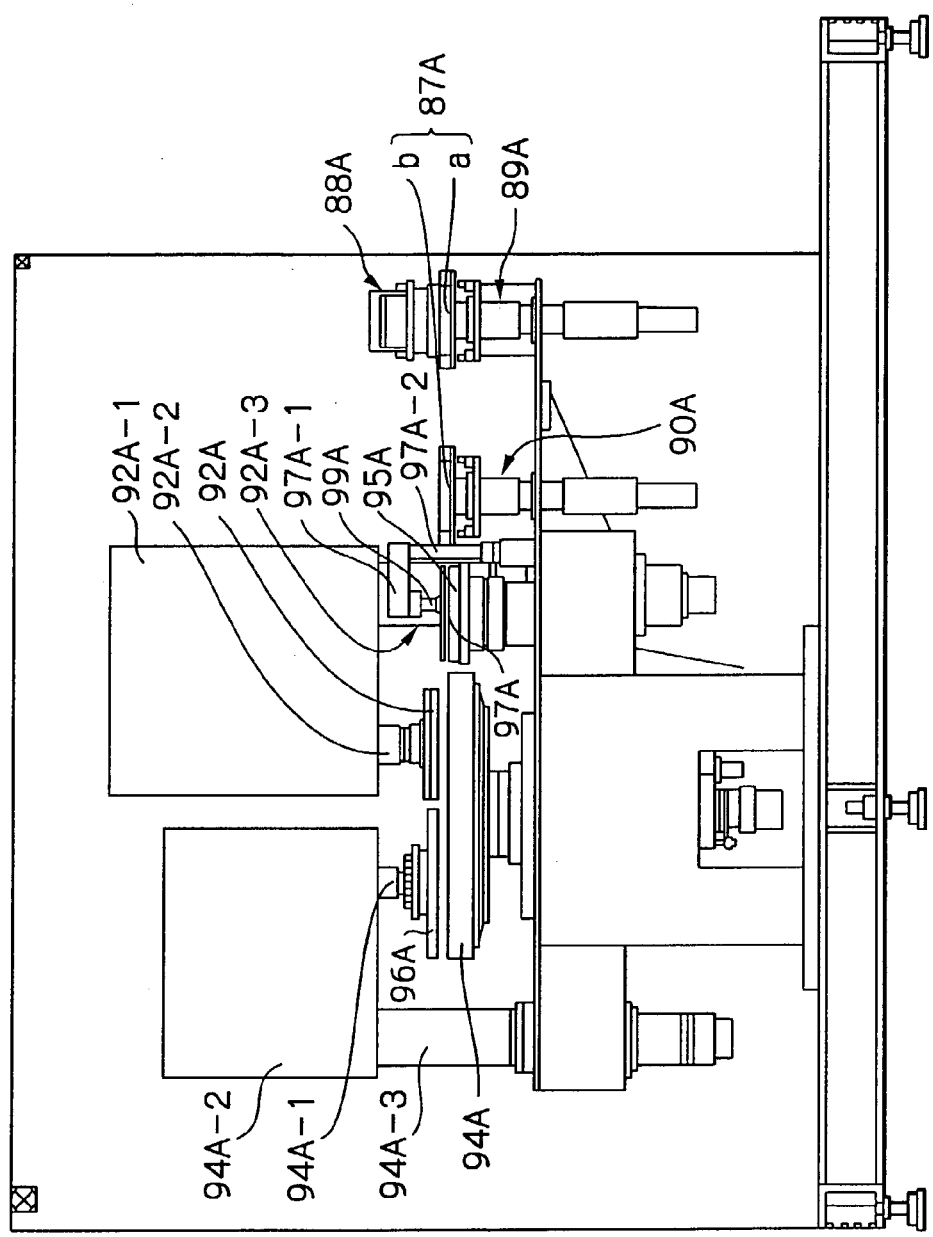
Figure 15:
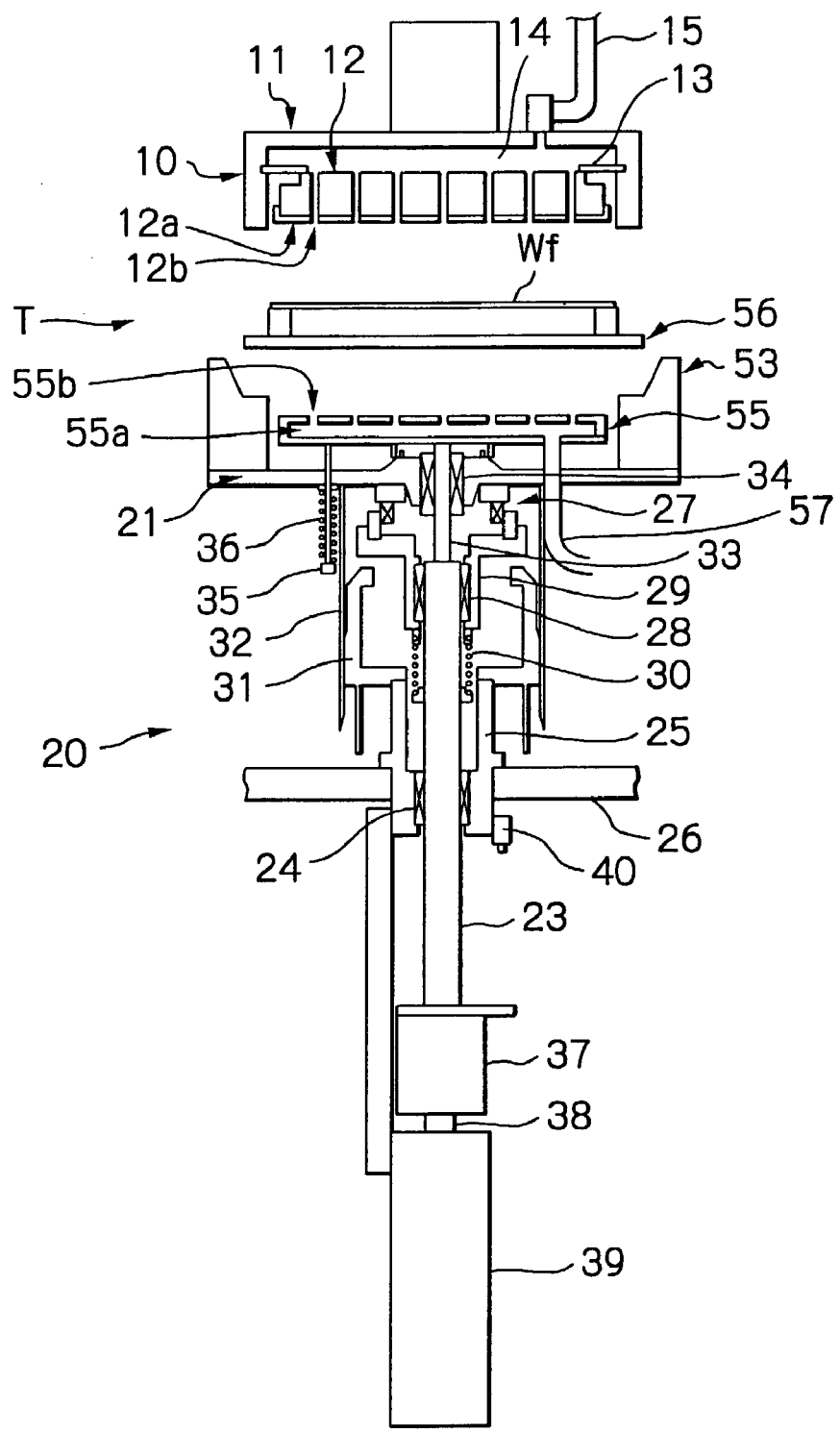
Figure 16:
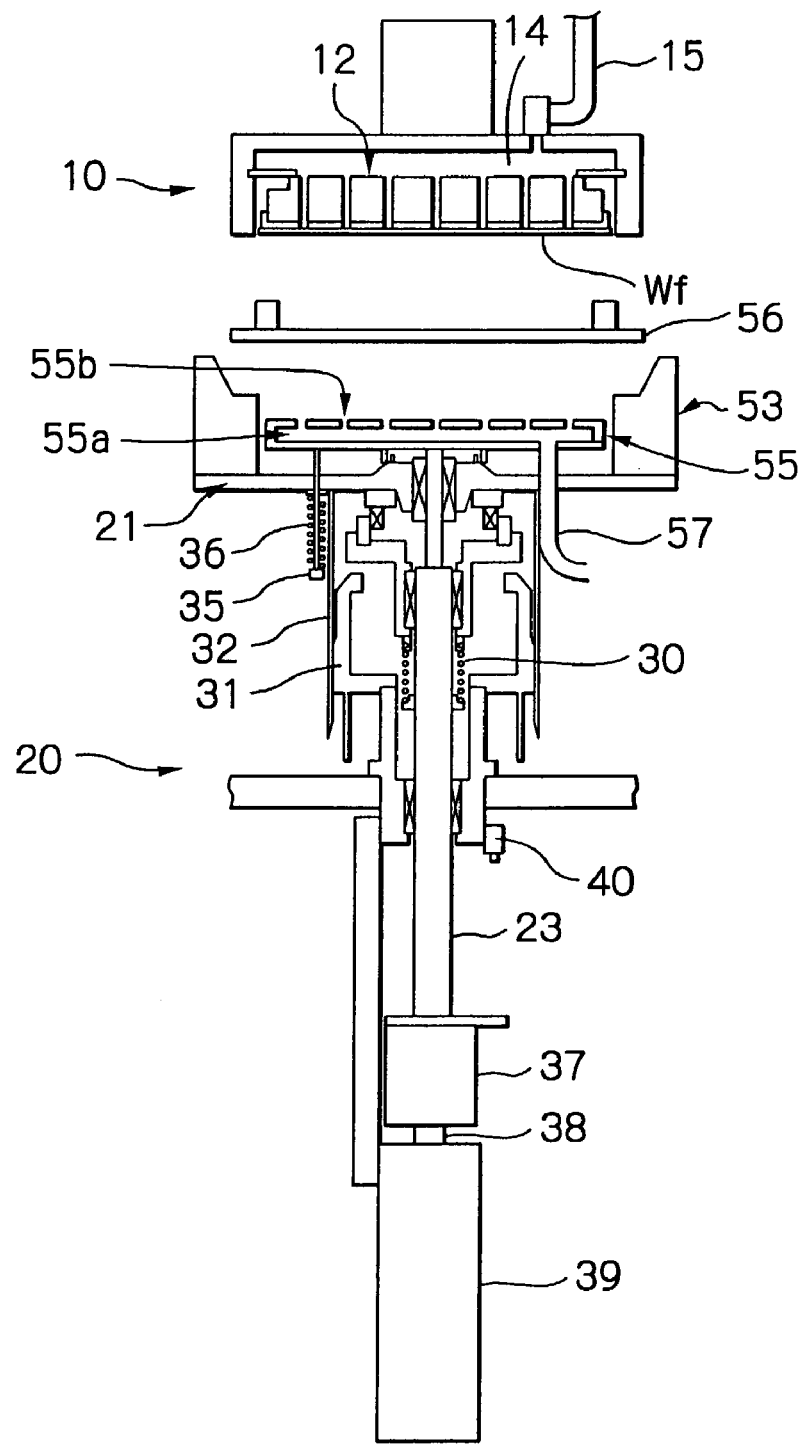
Figure 17:
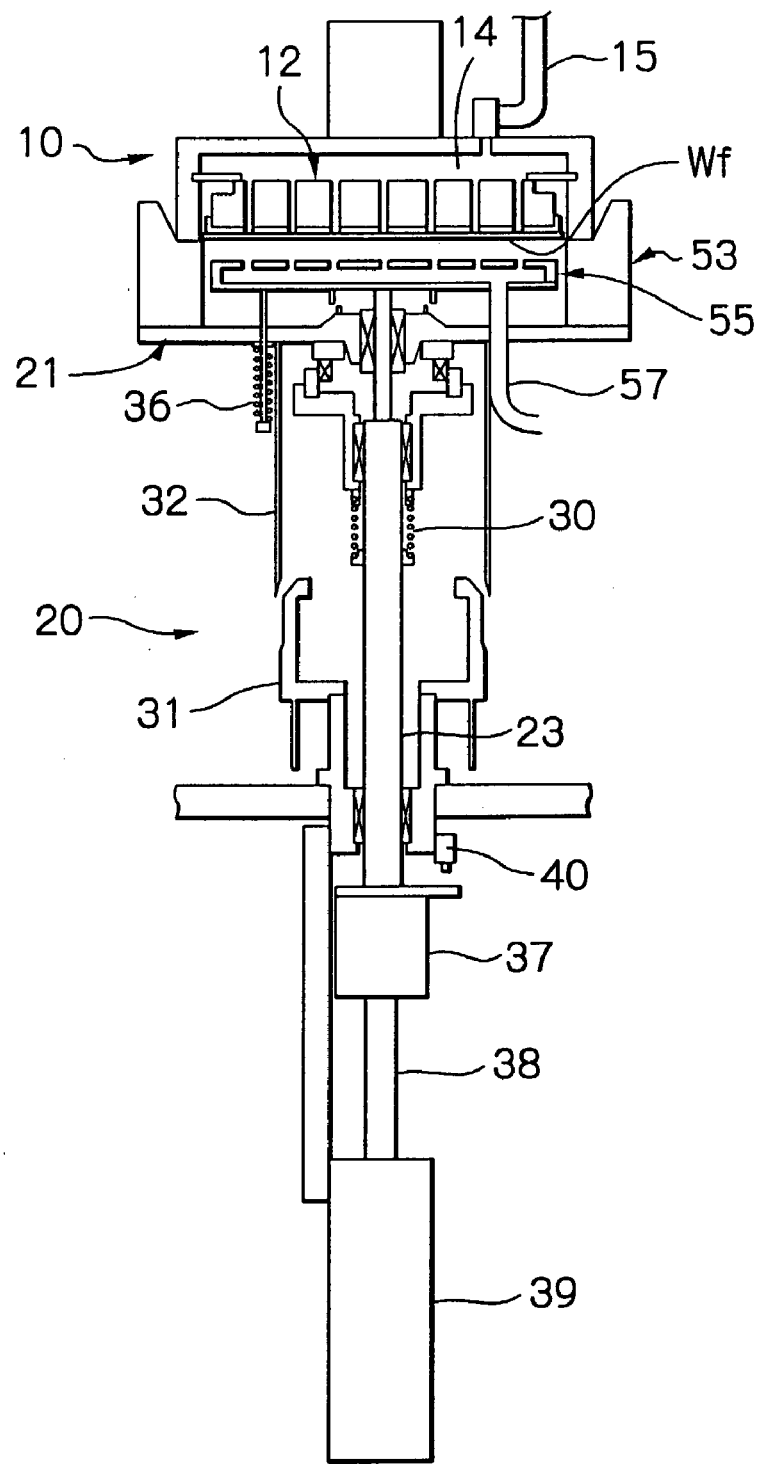
Figure 18:
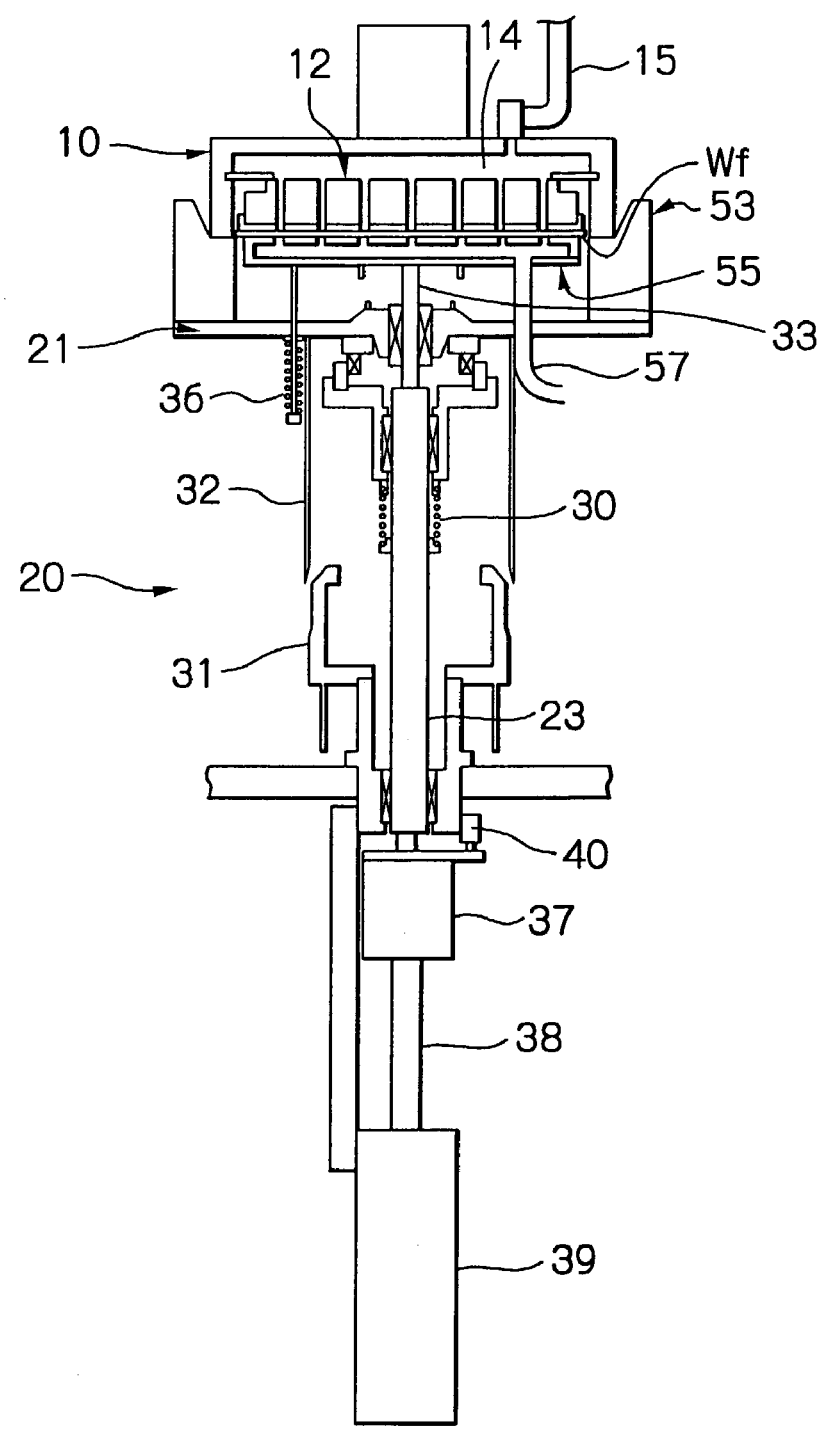
Figure 19:
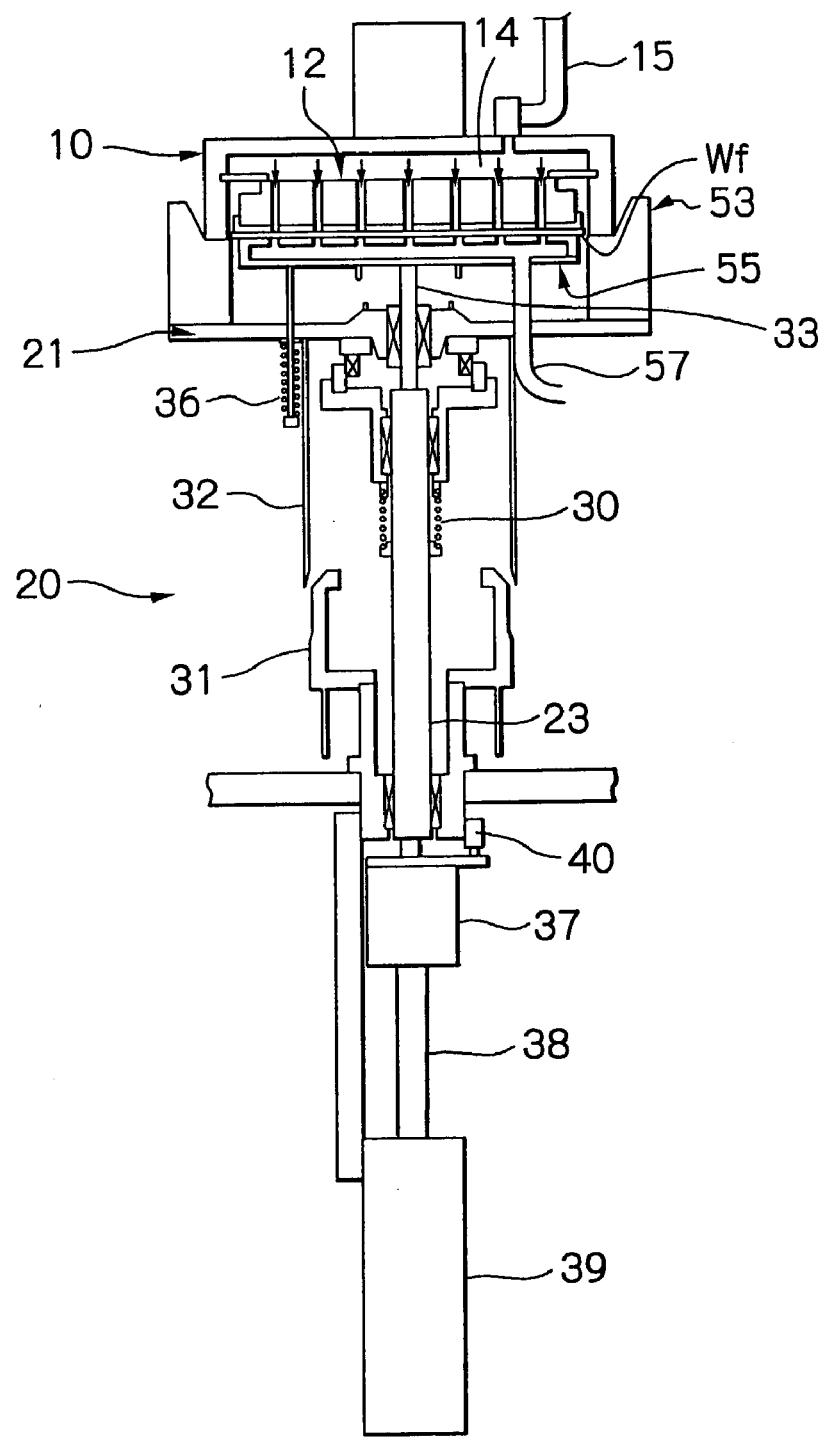
Figure 20:
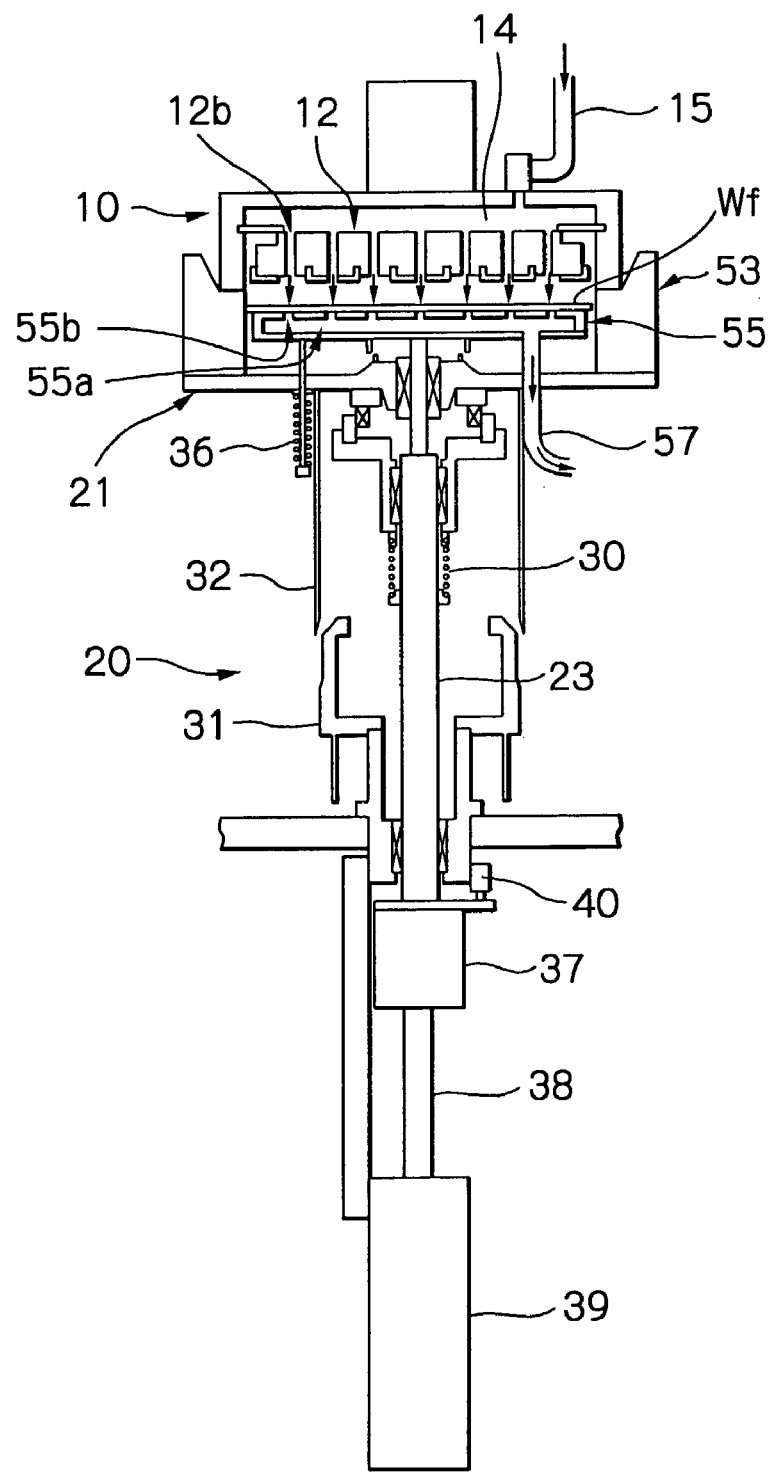
Figure 21:
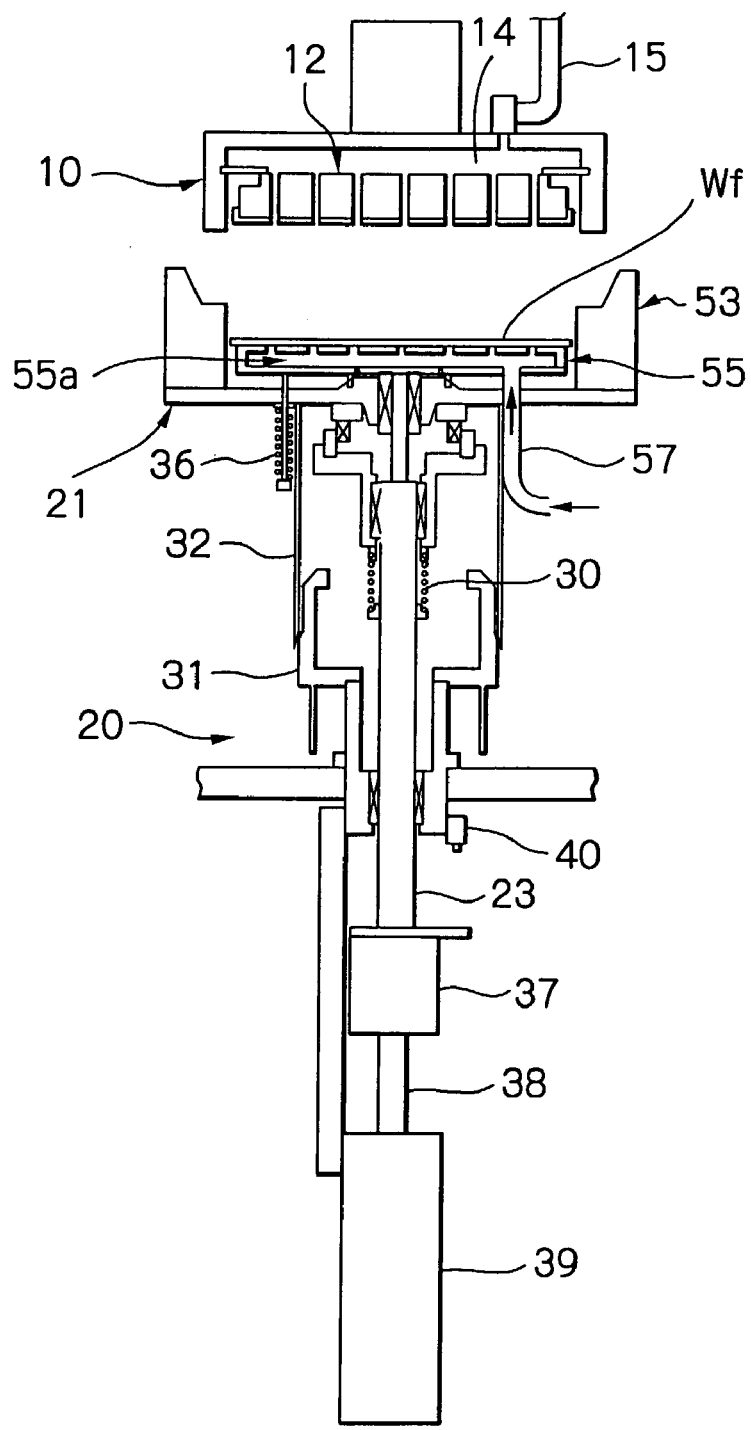
Figure 22:
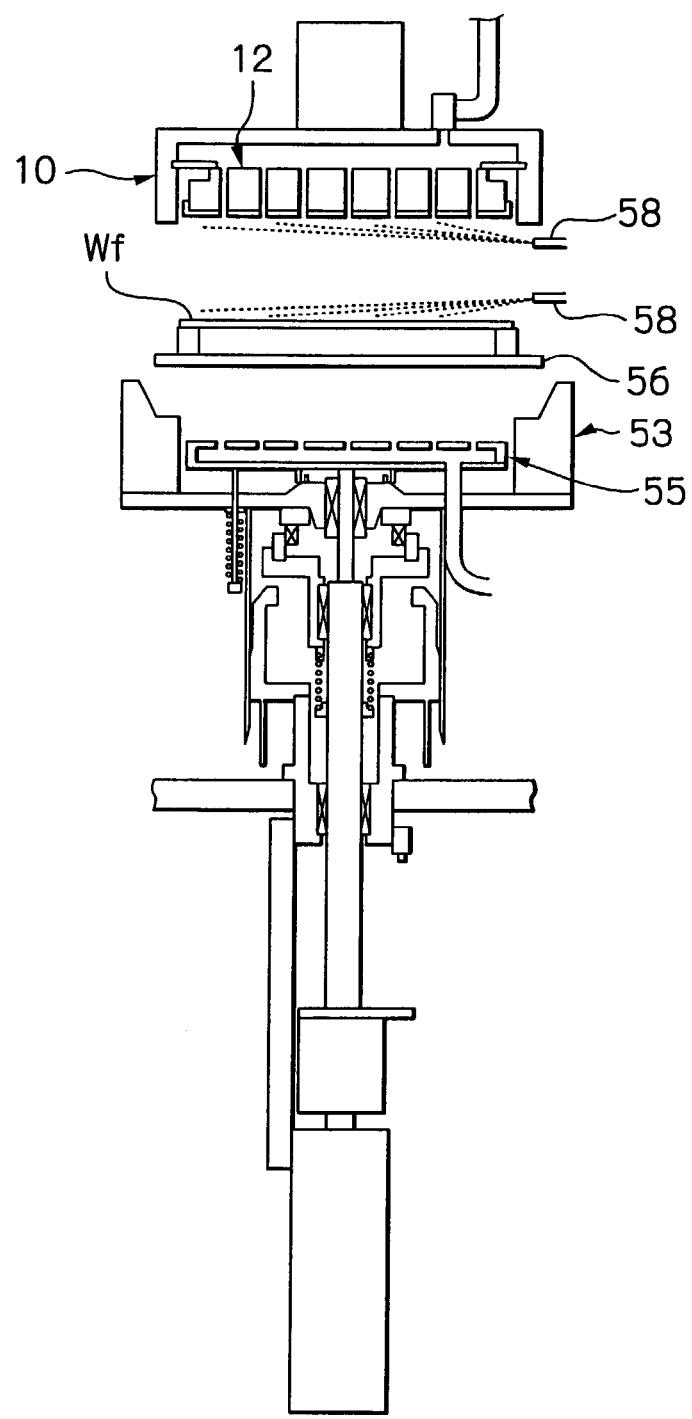
Figure 23:
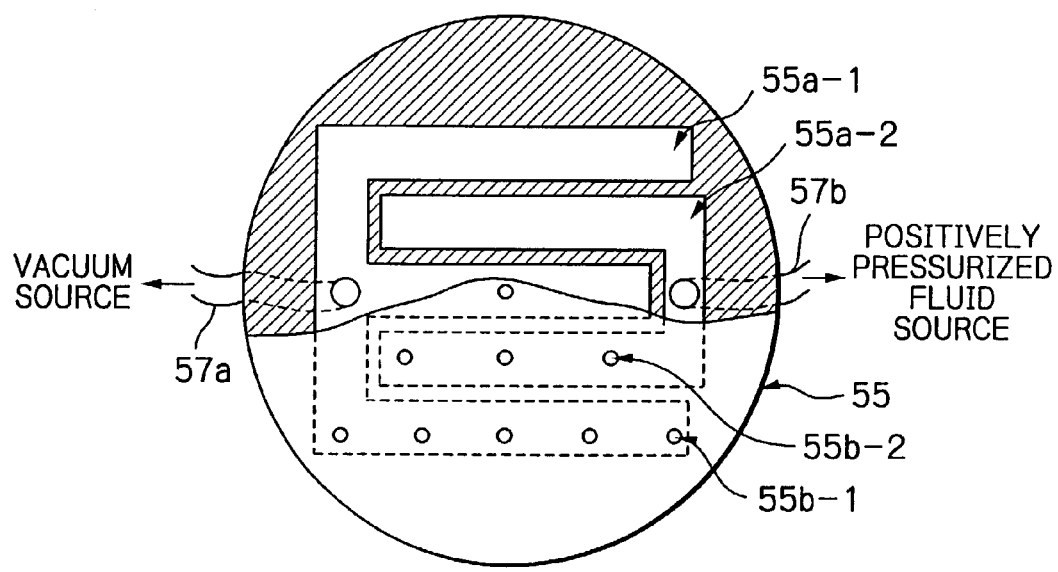

FIG(s) 12(a) and 12(b) are perspective views showing a part of a top ring guide and an upper portion of a pusher mechanism in the substrate delivery mechanism according to the present invention;

FIG. 13 is a plan view showing a configuration of a substrate polishing apparatus according to the present invention;

FIG. 14 is a schematic diagram showing an exemplary configuration of devices within a polishing zone in the substrate polishing apparatus according to the present invention;

FIG. 15 is a schematic diagram showing another exemplary configuration for a substrate delivery mechanism according to the present invention;

FIG. 16 is a schematic diagram for illustrating an operation of the substrate delivery mechanism according to the present invention;

FIG. 17 is another schematic diagram for illustrating another operation of the substrate delivery mechanism according to the present invention;

FIG. 18 is another schematic diagram for illustrating a further operation of the substrate delivery mechanism according to the present invention;

FIG. 19 is another schematic diagram for illustrating still another operation of the substrate delivery mechanism according to the present invention;

FIG. 20 is another schematic diagram for illustrating a still further operation of the substrate delivery mechanism according to the present invention;

FIG. 21 is another schematic diagram for illustrating a further operation of the substrate delivery mechanism according to the present invention;

FIG. 22 is another exemplary configuration for a substrate delivery mechanism according to the present invention; and FIG. 23 is a schematic diagram showing an exemplary configuration for a substrate loading table of the substrate delivery mechanism (FIG. 15) according to the present invention.

DETAILED DESCRIPTION OF THE PREFERRED EMBODIMENTS

Figure 1B:
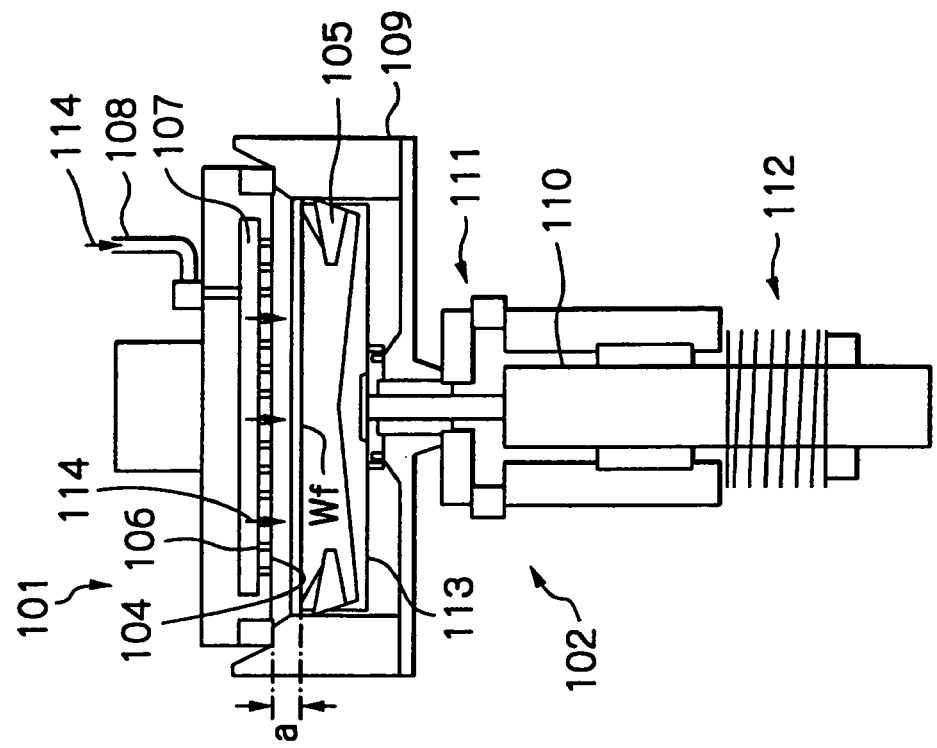
Figure 1A:
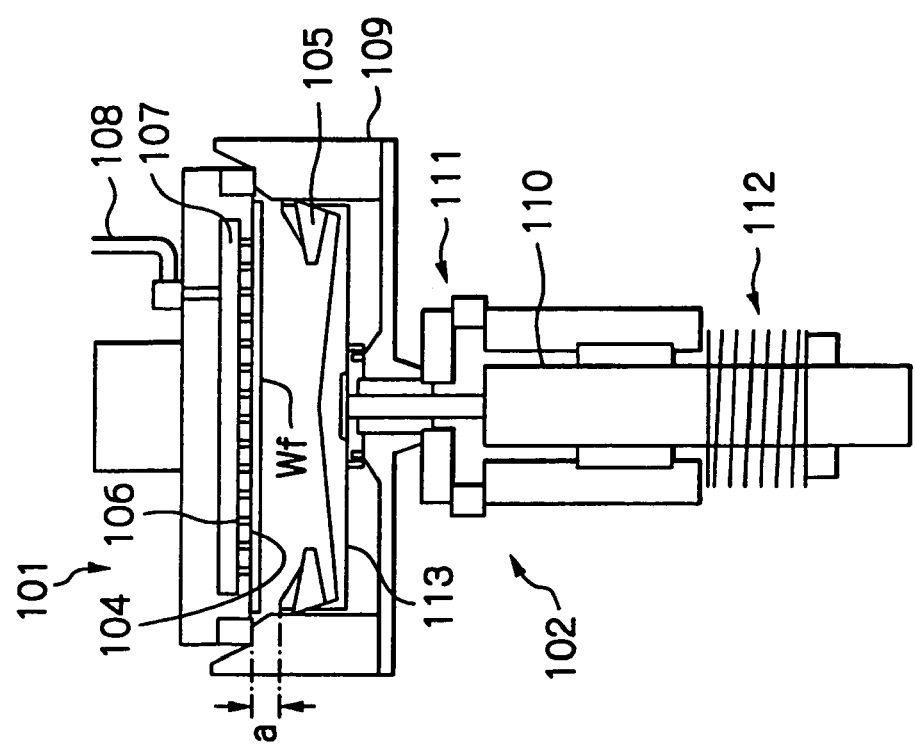
Figure 2:
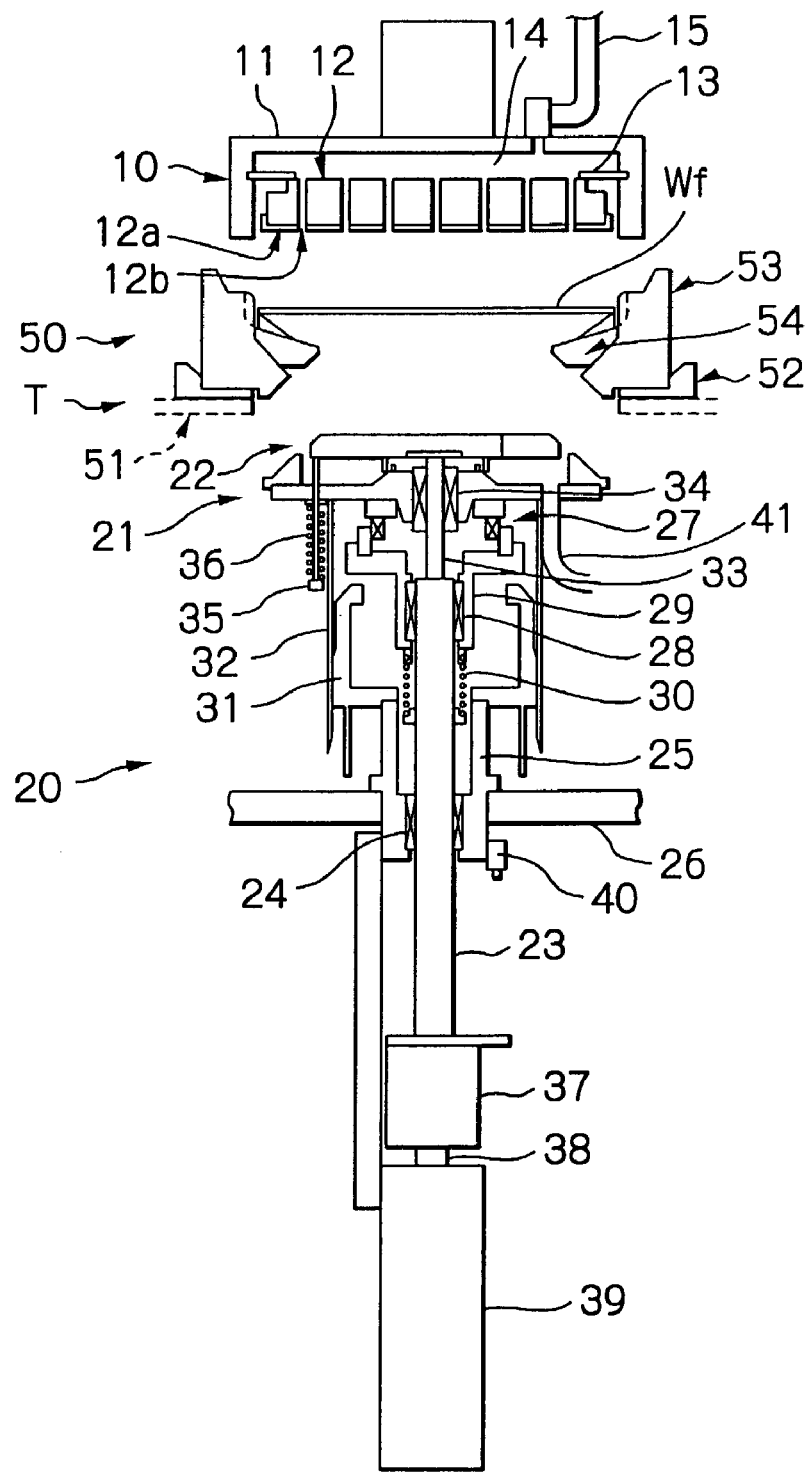
FIG. 2 is a schematic diagram showing an exemplary configuration for a substrate delivery mechanism according to the present invention.

Preferred embodiments of the present invention will now be described with reference to the attached drawings. FIG. 2 is a schematic diagram showing an exemplary configuration for a substrate delivery mechanism according to the present invention. As shown in this figure, the substrate delivery mechanism comprises a pusher mechanism for transferring or receiving a substrate "Wf" to or from a top ring (i.e., a substrate holder mechanism) 10 which is used to hold the substrate Wf, and a substrate loader 50 which is used to load and transfer the substrate Wf. The substrate loader 50 is designed such that it can be moved up and down by an elevator comprising a cylinder 39, a shaft 38 and other components of the pusher mechanism 20, which will be described later.

The top ring 10 comprises a cylindrical top ring body 11 with a closed top end, and the top ring body 11 includes a disc-like substrate holding plate 12 attached to a lower portion thereof with a support member 13. On a side above the substrate holding plate 12, a sealed space or a chamber 14 is defined by an upper surface of the substrate holding plate 12 together with that of the support member 13 and an inner surface of the top ring body 11. The chamber 14 is connected to a pressurizing/exhausting source (not shown) via a pipe 15. An elastic membrane 12a made of rubber material or the like is affixed to an under surface of the substrate holding plate 12, and a plurality of through-holes 12b is formed therethrough so as to be in communication with a plurality of chambers (not shown) defined thereby together with the substrate holding plate 12 and the substrate Wf.

In the top ring having a configuration as specified above, the substrate Wf may be vacuum-chucked on a substrate holding surface (a substrate contact surface) of the substrate holding plate 12 by exhausting the chamber 14 through the pipe 15. On the other hand, the substrate Wf can be detached from the substrate holding surface by supplying a fluid (a gas, a liquid or a mixture thereof) into the chamber 14 through the pipe 15, thereby injecting the fluid from the plurality of through-holes 12b.

The substrate loader 50 comprises, as will be described later in detail, a short cylindrical top ring guide 53 seated on a top ring guide stage 52 fixed to a transporter stage 51 of a transporter "T", and a substrate tray 54 accommodated in the top ring guide 53. Further, the substrate tray 54 has a tapered surface formed in a lower outer portion thereof, which is placed on a tapered surface formed in the top ring guide 53 so as to be engaged therewith and thereby to be located in a fixed position in vertical and horizontal directions.

The pusher mechanism 20 comprises a top ring guide lifting table 21 for lifting the top ring guide 53, and a substrate tray lifting table 22 for lifting the substrate tray 54. The pusher mechanism 20 further comprises a shaft 23 which is operatively supported by a frame structure 26 via a slide bearing 24 and a bearing housing 25 so as to be movable up and down freely. The above-mentioned top ring guide lifting table 21 is supported in an upper portion of the shaft 23 via a centering mechanism 27, a slide bearing 28, a bearing housing 29 and a spring 30.

A center sleeve 31 is fixed to a top end of the bearing housing 25, and a guide sleeve 32 is fixed to a bottom end of the top ring guide lifting table 21, in which an inner surface of the guide sleeve 32 is slidably engaged with an outer surface of the center sleeve 31. A shaft 33 fixed to a bottom end of the substrate tray lifting table 22 is operatively supported in a central area of the top ring guide lifting table 21 via a slide bearing 34 so as to be movable up and down freely.

A plurality of stroke pins 35 is fixed to an under surface of the substrate tray lifting table 22 at an outer periphery thereof, each of which extends downward through the through-holes formed in the top ring guide lifting table 21, and a stroke spring 36 is interposed between a bottom end of each stroke pin 35 and an under surface of the top ring guide lifting table 21. Reference numeral 37 designates a cylinder for moving up and down the shaft 23, and the cylinder 37 is fixed to a top end of the shaft 38 which is adapted to be moved up and down by the cylinder 39. Reference numeral 40 designates an upper limit end stopper. Also, the top ring guide lifting table 21 is connected with an exhaust pipe 41 in communication with a vacuum pumping mechanism.

FIG. 3 to FIG. 6 show an operation for transferring the substrate Wf from a transporter "T" to the top ring 10. FIG.

3 shows a state where the pusher mechanism 20 is in its home position and a load substrate stage (a substrate stage before being transferred to the top ring 10) of the transporter T is in a position right above the pusher mechanism 20. The transporter T is a mechanism, which will be described later in detail, serving to transport the substrate Wf horizontally from another substrate supplying position to a position of the pusher mechanism 20. Since the substrate tray 54 placed on the tapered portion within the top ring guide 53 is fixed in its position vertically and horizontally as described above, the substrate Wf in the substrate tray 54 is aligned concentrically with the pusher mechanism 20 in its horizontal position, and also a relative position in a vertical direction between them is maintained to be constant.

On the other hand, a horizontal position of the substrate Wf is restricted by a vertical inner surface of the top ring guide 53, which has a diameter slightly larger than an outer diameter of the substrate Wf. Further, the top ring guide 53 may be held in its vertical position by being seated on the top ring guide stage 52 fixed on the transporter stage 51 of the transporter T. Also, the top ring guide 53 may be held in its fixed horizontal position by a vertical surface of the top ring guide stage 52 that restricts an outer periphery of the top ring guide 53.

Figure 4:
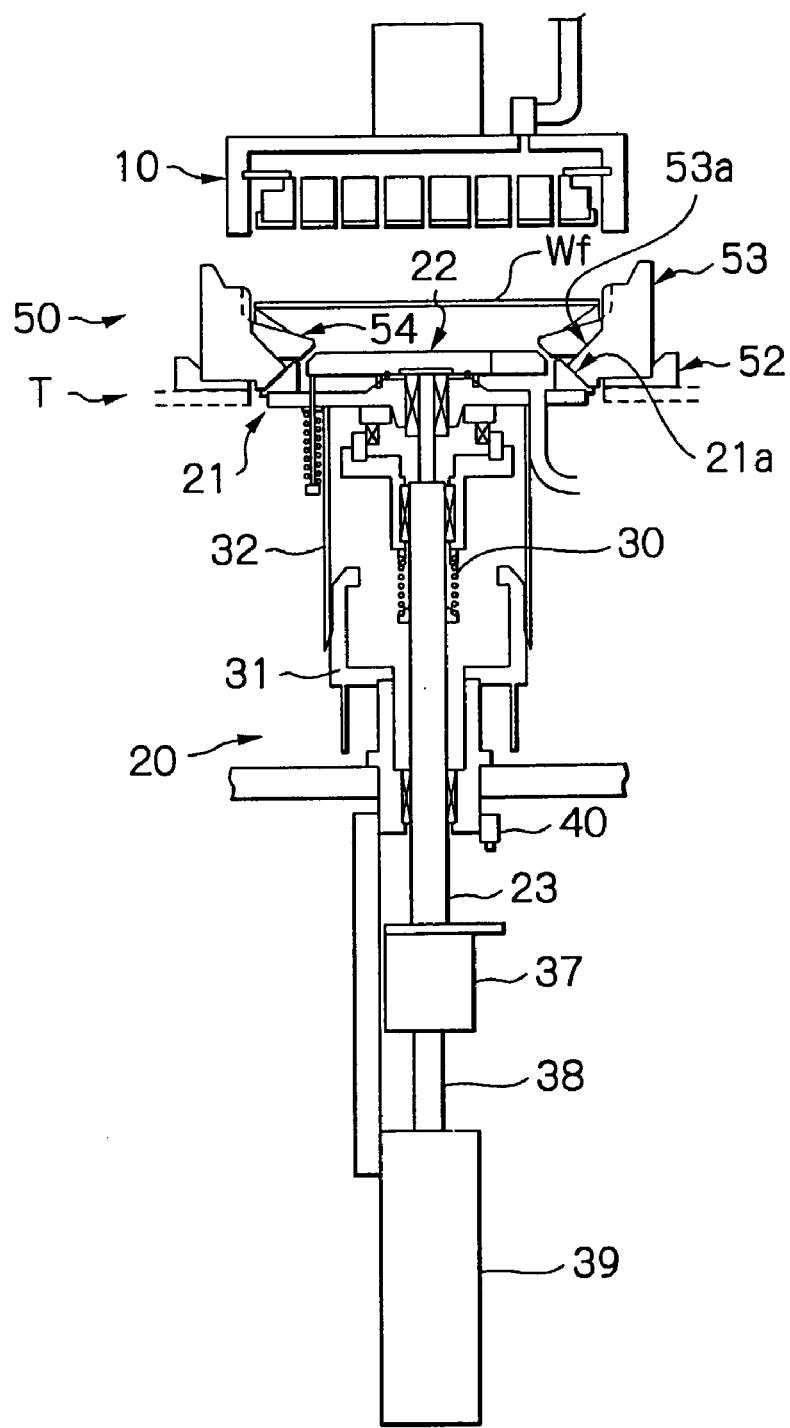
FIG. 4 is another schematic diagram for illustrating another operation of the substrate delivery mechanism according to the present invention.

FIG. 4 shows a state observed at a moment when the pusher mechanism 20 is receiving a substrate from the top ring guide 53. At this time, the cylinder 39 of the pusher mechanism 20 is in a non-stop motion from its contracted state toward its extending direction. During this operation, the outer peripheral tapered portion 21a of the top ring guide lifting table 21 is mated with the tapered portion 53a of the top ring guide 53 and thereby a horizontal position of the top ring guide 53 is adjusted such that a center thereof may align with a central axis of the shaft 23 of the pusher mechanism 20.

A horizontal position of the pusher mechanism 20 is restricted by a sliding motion between an inner surface of the guide sleeve 32 and an outer surface of the center sleeve 31. In addition, in conjunction with an extending motion of the cylinder 39, the shaft 38 is pushed up and thus the top ring guide lifting table 21 lifts the top ring 53. By way of this, the substrate tray 54 as well as the substrate Wf loaded on the top ring guide 53 are moved up.

Figure 5:
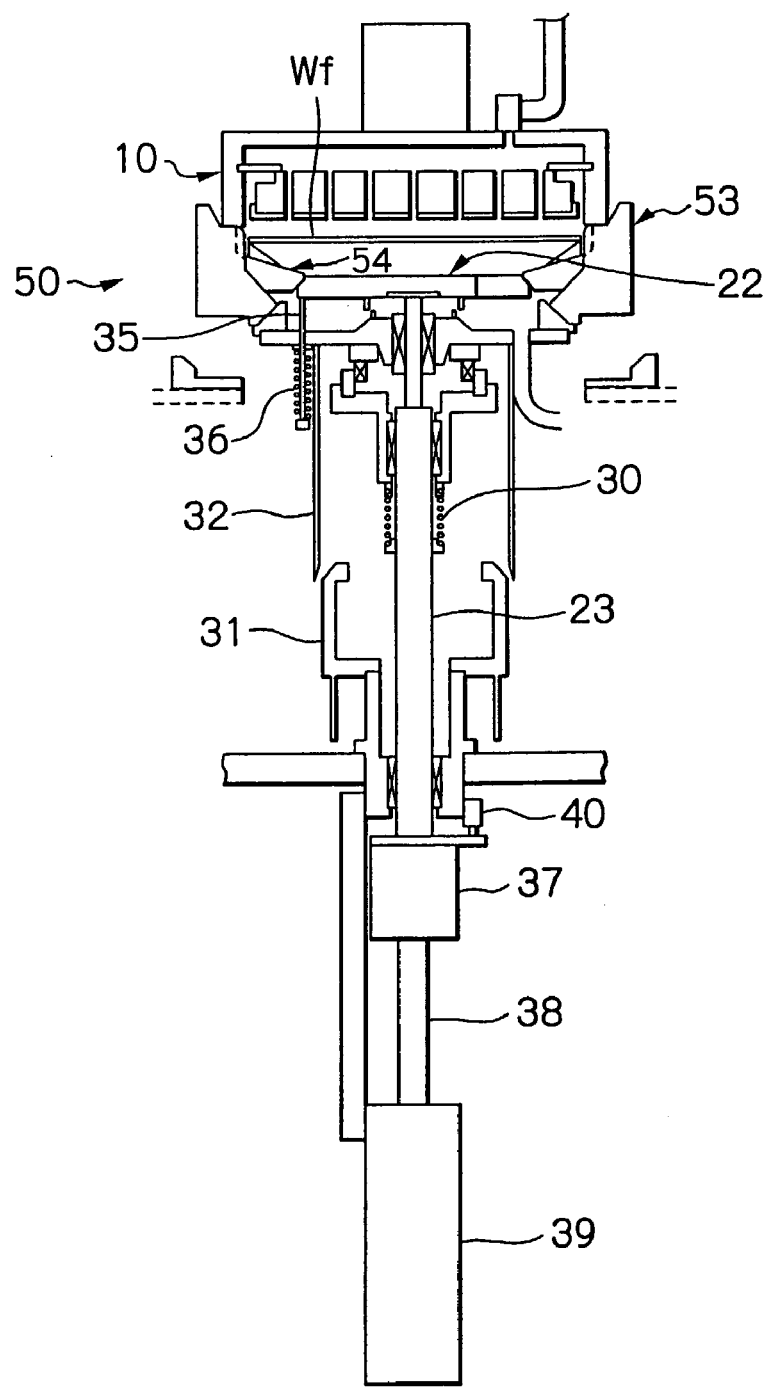
FIG. 5 is another schematic diagram for illustrating a further operation of the substrate delivery mechanism according to the present invention.

FIG. 5 shows a state where the pusher mechanism 20 has just finished positioning thereof with respect to the top ring 10. At this time, the cylinder 39 is in a state where the extending motion thereof is limited by the upper limit end stopper 40. The top ring guide 53 is operatively fitted with an outer periphery of the top ring 10 so as to align centers of the top ring 10 and the pusher mechanism 20 with each other. Further, at this time, the spring 30 is contracted and thereby absorbs an impact from contact of the top ring 10 with the top ring guide 53 supported by the pusher mechanism 20.

Figure 6:
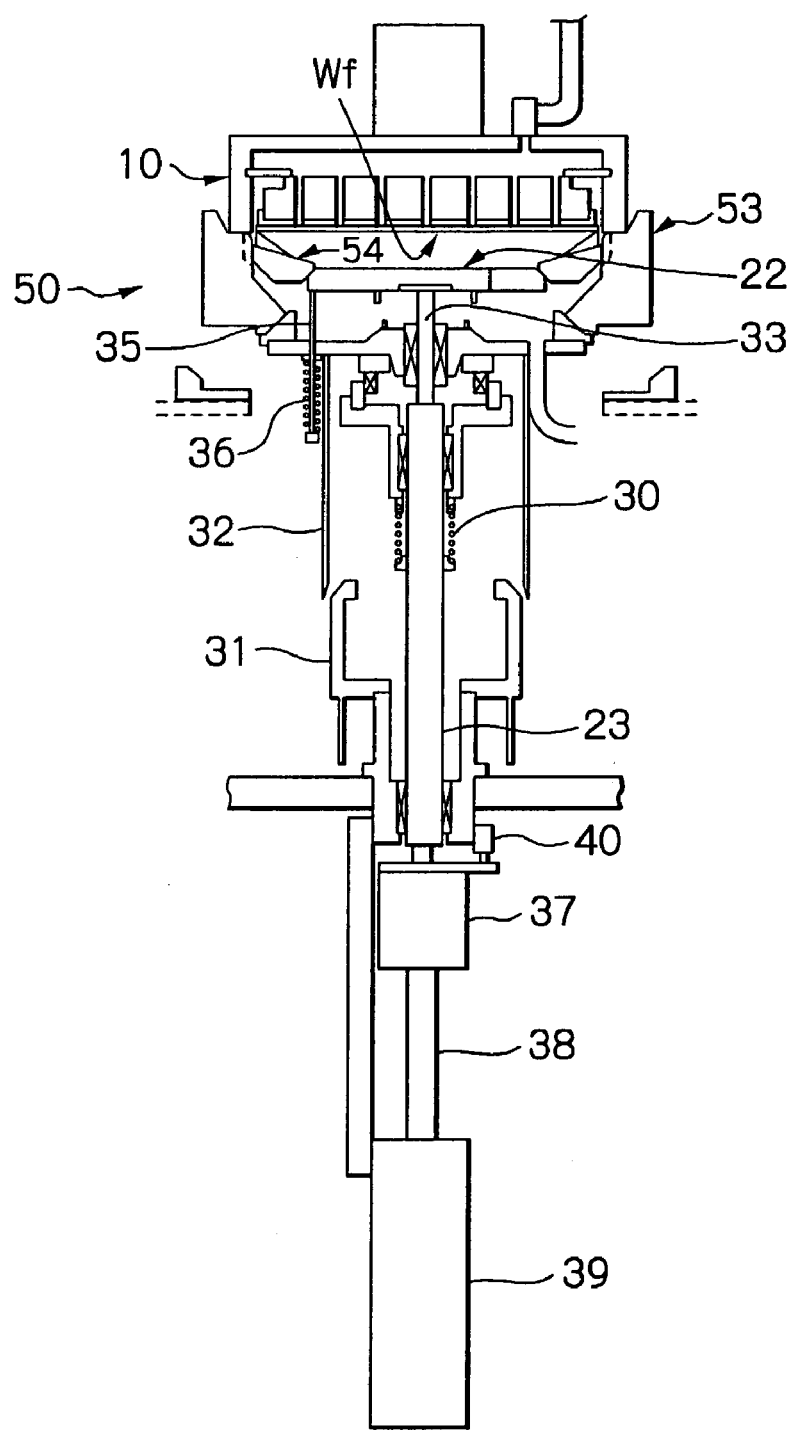
FIG. 6 is another schematic diagram for illustrating still another operation of the substrate delivery mechanism according to the present invention.

FIG. 6 shows a state where delivery (transfer) of the substrate Wf from the pusher mechanism 20 to the top ring 10 has been completed. The shaft 33 is pushed up with aid of an extending motion of the cylinder 37, and thereby the substrate tray 54 is pushed up by the substrate tray pushing table 22, so that the substrate Wf can reach the substrate holding surface of the top ring 10. At this time, a contact force of the substrate Wf against the top ring 10 is controllable by adjusting an action of the stroke spring 36 and a working air pressure of the cylinder 37, and, accordingly, there is no fear of any excessive impact being applied to the substrate Wf and the substrate holding surface.

Figure 7:
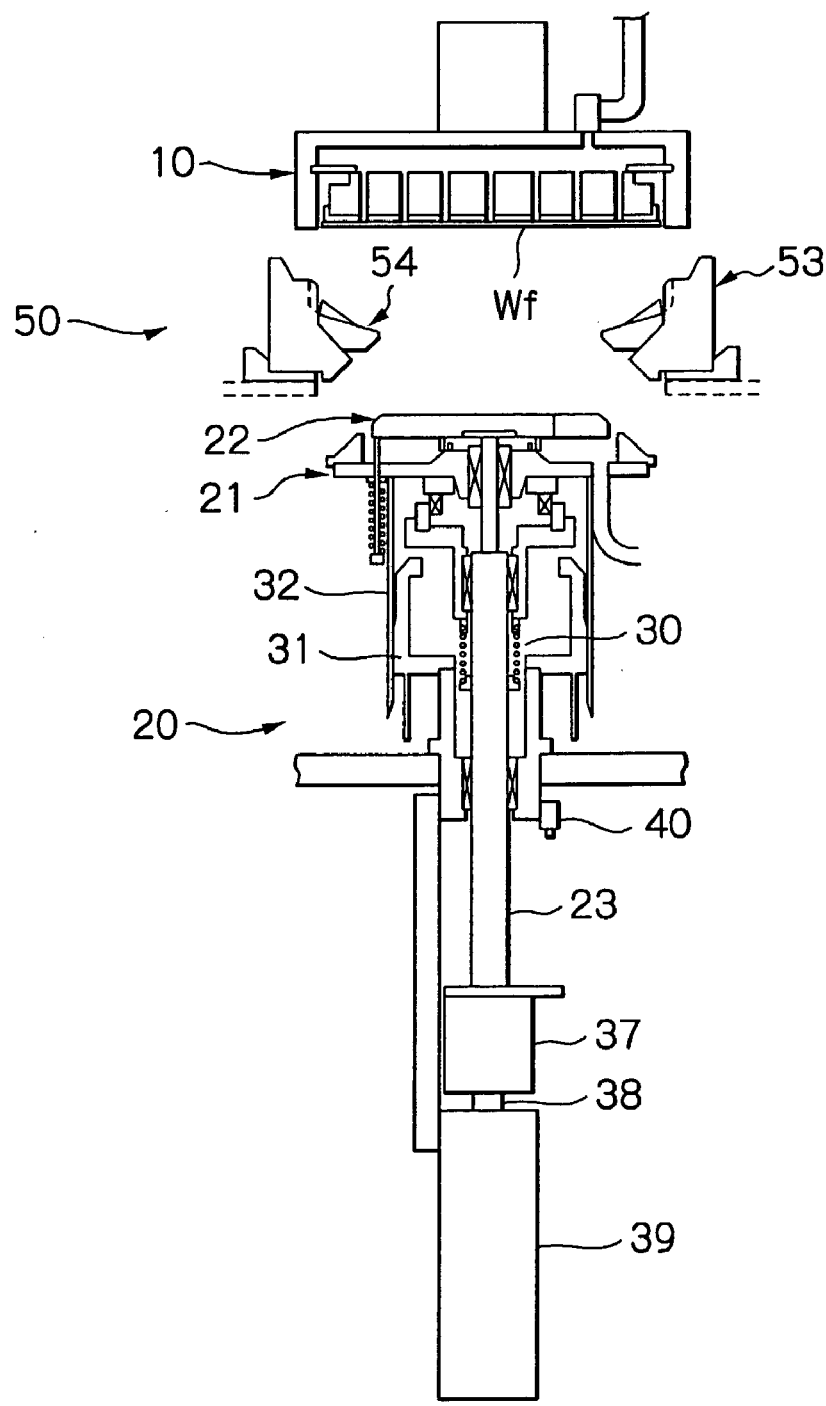
FIG. 7 is another schematic diagram for illustrating a still further operation of the substrate delivery mechanism according to the present invention.
Figure 8:
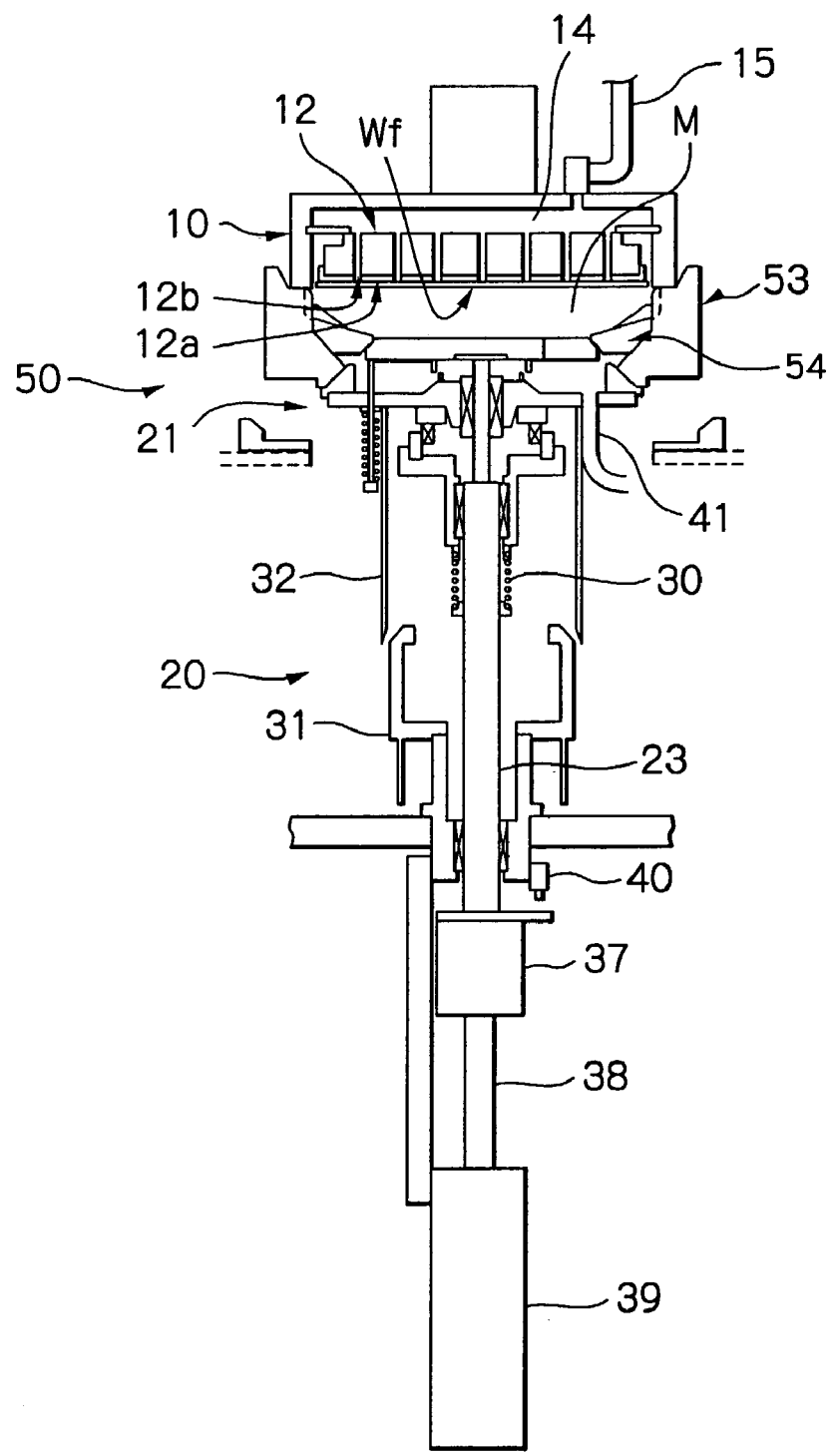
FIG. 8 is another schematic diagram for illustrating a further operation of the substrate delivery mechanism according to the present invention.
Figure 9:
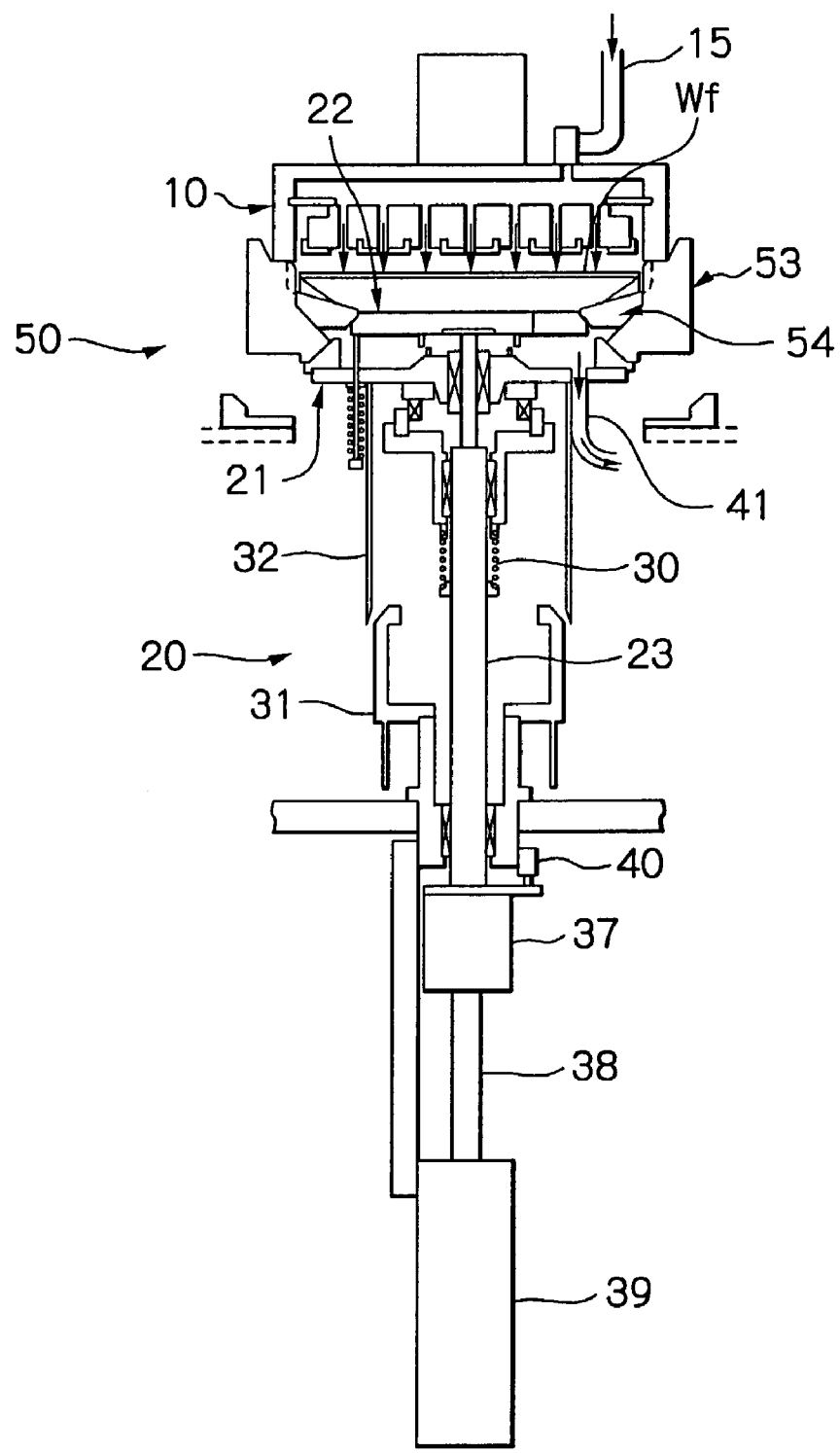
FIG. 9 is another schematic diagram for illustrating another operation of the substrate delivery mechanism according to the present invention.

FIG. 7 to FIG. 9 show an operation for transferring the substrate Wf from the top ring 10 to the transporter T. FIG. 7 shows a state where the pusher mechanism 20 is in its home position, a stage for a processed substrate of the transporter T is in a position at the pusher mechanism 20, and the top ring 10 is in a position right above the pusher mechanism 20. At this moment, the substrate Wf is held as it is being vacuum-chucked on the substrate holding surface of the top ring 10.

FIG. 8 shows a state where the substrate tray 54 loaded on the top ring guide 53 of the pusher mechanism 20 is in a position ready to receive the substrate Wf. At this time, the pusher mechanism 20 is in position with respect to the top ring 10, similarly to the state shown in FIG. 5. In this state, below the substrate Wf held by the top ring 10, a sealed space "M" is defined by an under surface of the top ring 10, an inner surface of the top ring guide 53, and an inner wall surface and the top surface of the top ring guide lifting table 21. Under this condition, the sealed space M is exhausted by a vacuum pumping mechanism, though not shown, via the exhaust pipe 41 so as to drop the substrate Wf onto the substrate tray 54, which will be carried out according to procedures (1) and (2) described below.

(1) Exhausting the Sealed Space M

The sealed space M is evacuated by the vacuum pumping mechanism, though not shown, via the exhaust pipe 41 so as to reduce pressure within the sealed space M to nearly a vacuum level. This can create a low pressure on a lower surface of the substrate Wf.

(2) Detaching Operation of the Substrate by the Top Ring 10

A fluid (a gas, a liquid or a mixture thereof) is supplied into the chamber 14 within the top ring 10 from the pressurizing/exhausting source, though not shown, via the pipe 15 so that the fluid may be injected from the plurality of through-holes 12b arranged in the substrate holding surface (i.e. an under surface of the substrate holding plate 12). This may increase pressure applied onto an upper surface of the wafer Wf to be higher than that applied to the lower surface of the substrate Wf.

Due to differential pressure, produced through the operations of (1) and (2) stated above, between opposite sides of the substrate Wf, the substrate Wf may be detached easily from the substrate holding surface even in a circumstance where the substrate Wf adheres tightly to the substrate holding surface (the elastic membrane 12a made of rubber or the like) of the top ring 10. Especially in a case where the fluid (the gas, the liquid or the mixture thereof) is supplied into the chamber 14 of the top ring 10, and thus generated fluid pressure is used to press the substrate Wf via the elastic membrane 12a made of rubber or the like against a polishing surface of a polishing table so as to polish a surface of the substrate Wf, when the fluid is injected from the through-holes 12b in an attempt to detach the substrate Wf from the substrate holding surface of the top ring 10 after a polishing operation has been completed, even if the substrate Wf is pushed away by a certain distance from the under surface of the substrate holding plate 12 of the top ring 10, the elastic membrane 12a is likely to deform and remain adhering to the substrate Wf. Thus, a longer time is required to detach the substrate Wf completely. However, in the above described method of the invention, since the sealed space M is evacuated to further reduce the pressure on the lower surface side of the substrate Wf, the substrate can be detached easily.

As discussed above, due to the operation of (1) and (2), the substrate can be detached from the top ring in a shorter time as compared to a method according to the prior art in which only fluid is injected against the substrate holding surface of the top ring. In addition, in order to prevent any stress from being generated on the top and the under surfaces of detached substrate Wf due to the differential pressure, a residual pressure release channel is provided in the top ring guide 53, which will be described later in detail.

FIG. 9 shows a state where the substrate Wf has been transferred from the top ring 10 onto the substrate tray 54. At this time, the substrate tray 54 is loaded on the substrate tray lifting table 22 supported by the pusher mechanism 20. Then, the top ring guide lifting table 21 of the pusher mechanism 20 is lowered by a retracting motion of the cylinder 39, as shown in FIG. 10.

Figure 10:
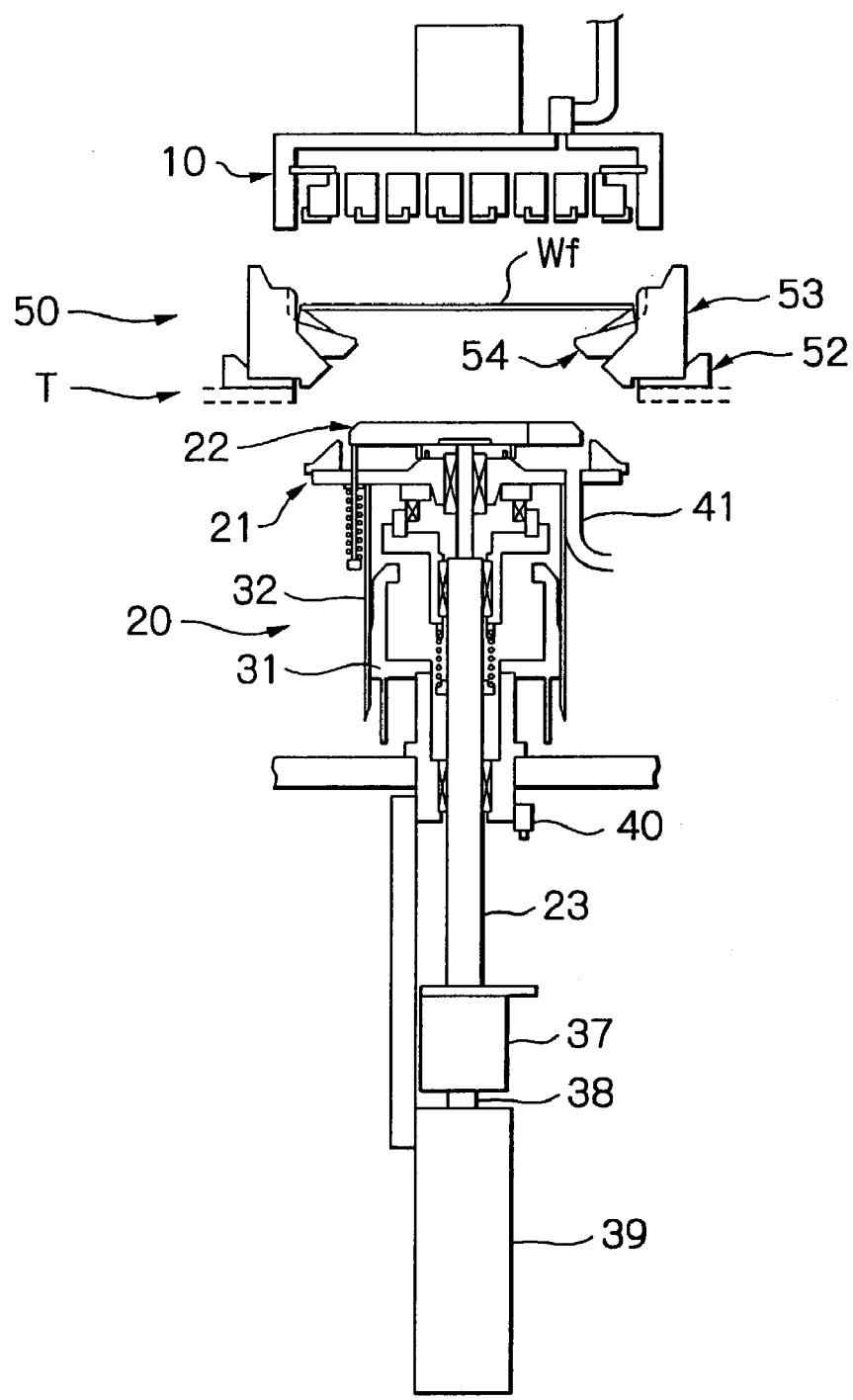
FIG. 10 is another schematic diagram for illustrating still another operation of the substrate delivery mechanism according to the present invention.

FIG. 10 shows a state where the pusher mechanism 20 has completed an operation for delivering the substrate tray 54 carrying the substrate Wf placed thereon, and the top ring guide 53 having the substrate tray 54 loaded thereon, onto the transporter T. This operation is performed by the retracting motion of the cylinder 39 as discussed above, and wherein, the top ring guide 53 is delivered to the top ring guide stage 52 on the transporter T. The top ring guide 53 is held in position by the tapered portion of the top ring guide stage 52. Accordingly, the substrate tray 54 loaded in the top ring guide 53, and thus the wafer Wf, are to be delivered to the transporter in a condition of being held in position.

Figure 11A:
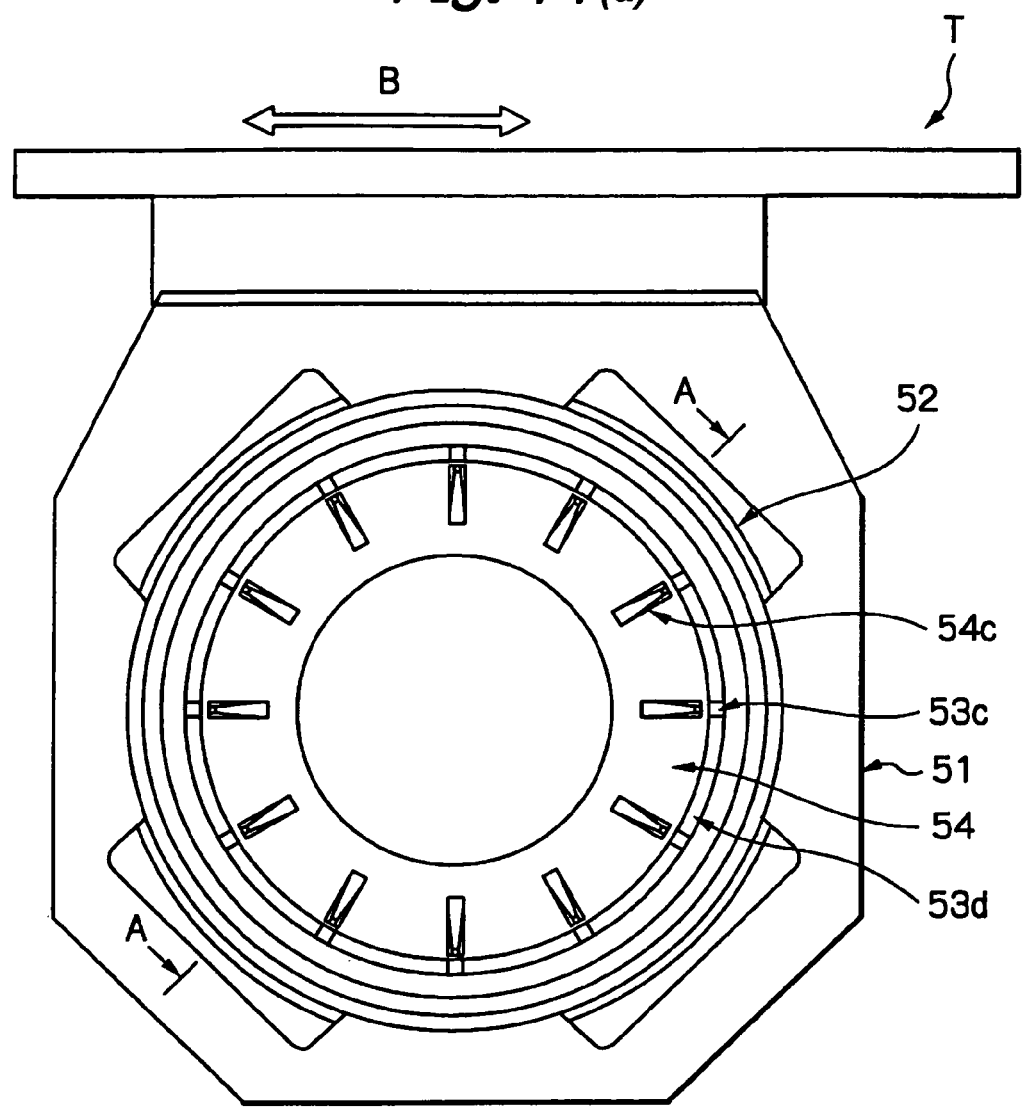
Figure 11B:
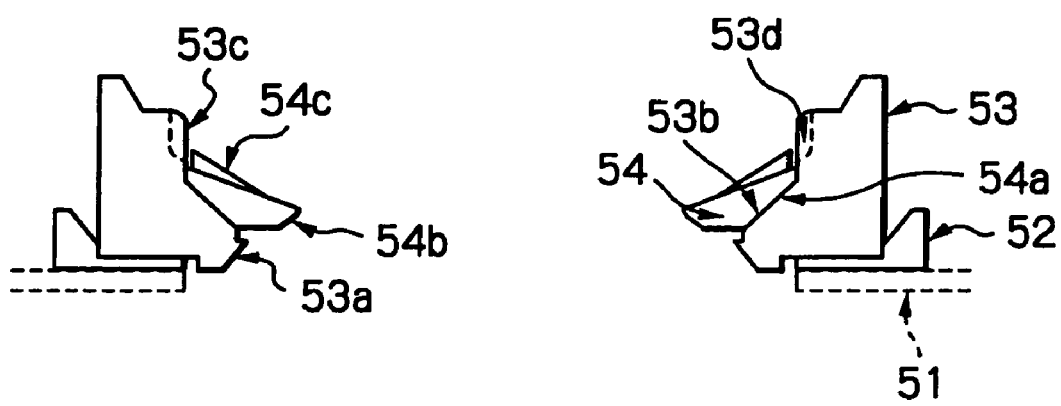

FIG. 11 (a) is a top view of the top ring guide 53, the substrate tray 54 and the transporter T, and FIG. 11 (b) is a sectional view taken along line A—A of FIG. 11(a). The transporter T is a linear transporter moving linearly in directions indicated by arrow B, which comprises a plurality (four in FIG. 11(a)) of top ring guide stages 52 arranged circumferentially at predetermined locations in the plate-shaped transporter stage 51. A vertical position of the top ring guide 53 is fixed by seating the top ring guide 53 on the top ring guide stage 52, and a horizontal position thereof is fixed by vertical surfaces of the top ring guide stages 52.

The top ring guide 53 has a short cylindrical shape whose inner surface (a loading surface of the substrate tray 54) is formed to have a tapered surface 53b, and whose bottom inner surface (surface engaging with the top ring guide lifting table 21) is also formed into a tapered surface 53a. In addition, a plurality (twelve in FIG. 11) of guide projections 53c for guiding the substrate Wf and the substrate tray 54 is provided at a predetermined interval on a vertical inner surface of the top ring guide 53, and a plurality of residual pressure release channels 53d is also provided on the same vertical inner surface, which serves to release residual pressure when the substrate Wf has dropped onto the substrate tray 54.

The substrate tray 54 has a ring shape whose bottom outer corner is formed into a tapered surface 54a and whose bottom inner corner is formed into a tapered surface 54b. In addition, a plurality (twelve in FIG. 11) of substrate carrier projections 54c is formed in a top surface region of the substrate tray 54 for carrying the substrate Wf. In this configuration, when the substrate tray 54 is accommodated in the top ring guide 53, the tapered surface 54a of the substrate tray 54 comes into engagement with the tapered surface 53a of the top ring guide 53.

Figure 12A:
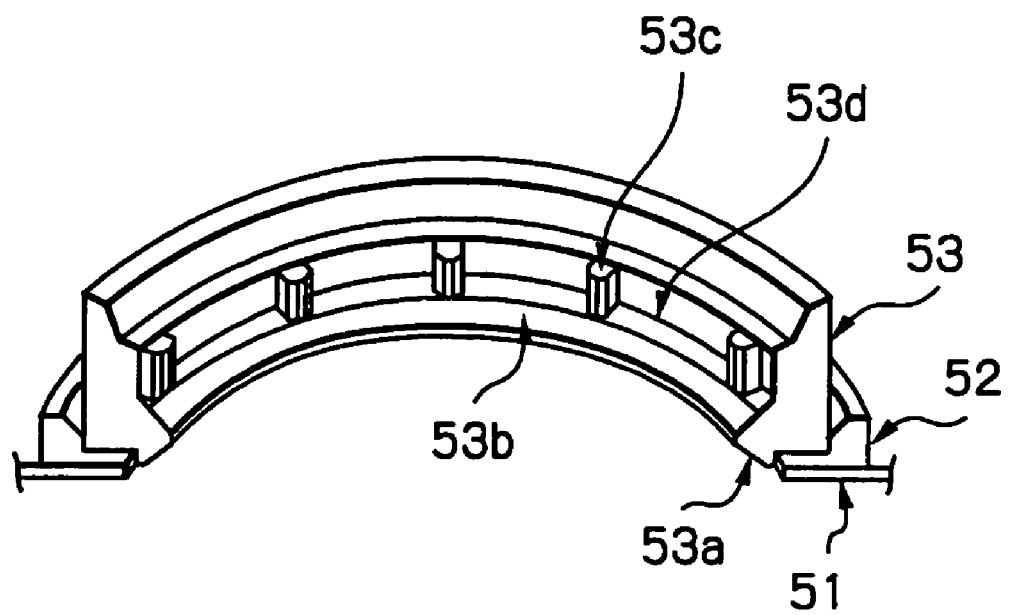
Figure 12B:
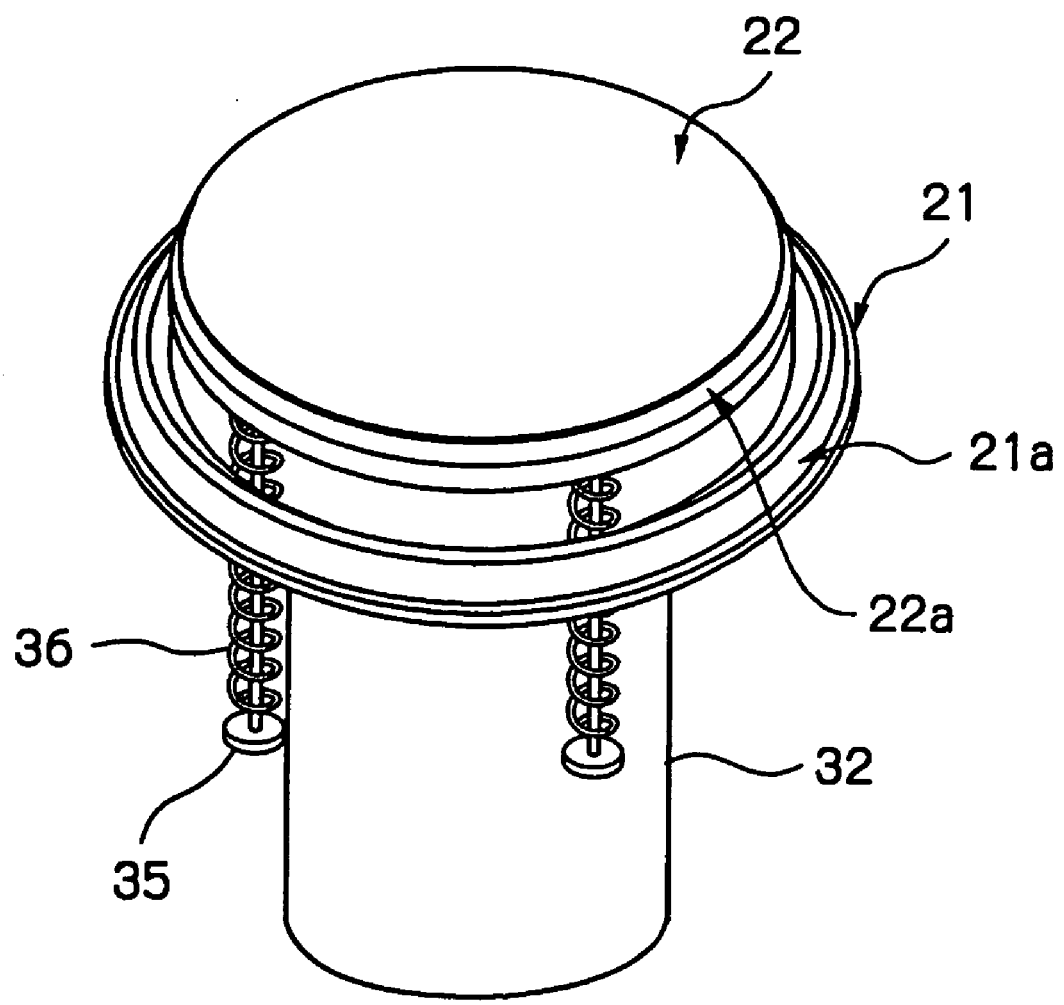

FIGS. 12(a) and 12(b) are perspective views showing a general configuration of the top ring guide 53 and the top ring guide lifting table 21. As illustrated, an upper peripheral region of the top ring guide lifting table 21 is formed into a tapered surface 21a, which is to be engaged with the tapered surface 53a of the top ring guide 53, and the substrate tray lifting table 22 is disposed in a central region of a top surface thereof. The substrate tray lifting table 22 has a circular plate-shape and is supported by the shaft 33 (see FIG. 2), and an outer periphery of the substrate tray lifting table 22 is formed into a tapered surface 22a, which is to be engaged and thus fitted with the tapered surface 54b formed in the bottom inner corner of the substrate tray 54.

It is to be noted that a rubber sheet may be affixed onto the tapered surface 53a of the top ring guide 53, the tapered surface 21a of the top ring guide lifting table 21, and the surface of the top guide 53 engaging with the top ring 10 so that when the sealed space M is defined as surrounded by the under surface of the top ring 10, the inner surface of the top ring guide 53, and the inner and the top surfaces of the top ring guide lifting table 21, as shown in FIG. 8, air-tightness of the sealed space M may be improved.

FIG. 13 is a plan view showing an exemplary configuration for a substrate polishing apparatus according to the present invention. This substrate polishing apparatus comprises four load/unload stages 62 on which substrate cassettes 61 for stocking a number of substrates such as semiconductor wafers are placed. Two cleaning machines 65, 66 are arranged on an opposite side of the substrate cassettes 61 with respect to a travel mechanism 63 for a transfer robot 64 interposed therebetween as an axis of symmetry. Each of the cleaning machines 65, 66 is arranged in a location reachable by a hand of the transfer robot 64. Further, a substrate station 67 is arranged between these two cleaning machines 65, 66 in a location reachable by the hand of the transfer robot 64, with the substrate station 67 comprising four substrate carrier tables 67-1, 67-2, 67-3 and 67-4.

A barrier wall 74 is arranged to separate cleanliness between a zone "B", in which the cleaning machines 65, 66 and the wafer carrier tables 67-1, 67-2, 67-3 and 67-4 are arranged, and a zone "A" in which the substrate cassettes 61 and the transfer robot 64 are arranged, and the barrier wall 74 is provided with an opening through which a substrate is transferred from one zone to the other and the opening is equipped with a shutter 71. A transfer robot 80 is placed in a location from where it can reach the cleaning machines 65 and three of the carrier tables 67-1, 67-3 and 67-4, while a transfer robot 81 is placed in a location from where it can reach the cleaning machine 66 and three of the carrier tables 67-2, 67-3 and 67-4.

A cleaning machine 82 is arranged adjacent to the cleaning machine 65 in a location where it can be reached by a hand of the transfer robot 80. Similarly, a cleaning machine 83 is arranged adjacent to the cleaning machine 66 in a location reachable by a hand of the transfer robot 81. The cleaning machines 65, 66, 82 and 83, the carrier tables 67-1, 67-2, 67-3 and 67-4 of the substrate station 67, and the transfer robots 80, 81 are all located within zone B, which is controlled to be at a lower pressure than that in zone A. The cleaning machines 82 and 83 are designed as a cleaning machine capable of double-side washing.

This substrate polishing apparatus has a housing (though not shown) to enclose respective machines and equipment, and the housing is partitioned into a plurality of chambers by the barrier wall 74 and barrier walls 84A and 84B. The barrier walls 84A and 84B partition off two zones C and D separately from zone B, defining thereinside two substrate polishing chambers, respectively. Polishing tables 94A and 95A are arranged in zone C, while polishing tables 94B and 95B are arranged in zone D. A top ring 92A and a top ring 92B are arranged in zone C and zone D, respectively.

Further, an abrasive liquid nozzle 93A serving for supplying an abrasive liquid, and a dresser 96A providing a dressing operation for the polishing table 94A, are arranged for the polishing table 94A within zone C. Similarly, an abrasive liquid nozzle 93B serving for supplying an abrasive liquid, and a dresser 96B providing a dressing operation for the polishing table 94B, are arranged for the polishing table 94B within zone D. A dresser 97A and a dresser 97B are further arranged to provide dressing operations for the polishing table 95A in zone C and the polishing table 95B in zone D, respectively.

The polishing table 94A, 94B is equipped with, in addition to mechanical dresser 96A, 96B, atomizer 98A, 98B for spraying a mixed fluid of a liquid (e.g., a purified water) and a gas (e.g., nitrogen) in the form of mist from a plurality of nozzles thereof. The mixed fluid is sprayed over a polishing surface of the polishing table 94A, 94B from the atomizer 98A, 98B to thereby wash away accumulated and clogged debris and particles of slurry from the polishing surface, and the mechanical dresser 96A, 96B also performs a dressing operation on the polishing surface, so that desirable dressing, or regeneration of the polishing surface may be accomplished.

A turn-over machine 88A serving to turn over a substrate is arranged at a location in zone C reachable by the hand of the transfer robot 80, and a turn-over machine 88B serving to turn over a substrate is arranged at a location in zone D reachable by the hand of the transfer robot 81. Further, the barrier walls 84A and 84B partitioning off zones C and D from zone B, respectively, are provided with openings used to transfer a substrate, and these openings are also equipped with shutters 85A and 85B dedicated for these turn-over machines 88A and 88B, respectively.

The turn-over machine 88A, 88B comprises a chuck mechanism for chucking a substrate, a turn-over mechanism for turning over the substrate in an upside down manner, and a substrate presence detecting sensor for determining whether or not the substrate is chucked by the chuck mechanism. It is to be also noted that substrates are conveyed to the turn-over machine 88A by the transfer robot 80 and to the turn-over machine 88B by the transfer robot 81.

A linear transporter 87A is also arranged in zone C, which works as a transfer mechanism for transferring a substrate between the turn-over machine 88A and the top ring 92A. Similarly, a linear transporter 87B is also arranged in zone D, which works as a transfer mechanism for transferring a substrate between the turn-over machine 88B and the top ring 92B.

FIG. 14 shows a physical relationship among the top ring 92A, the polishing tables 94A and 95A, the linear transporter 87A, a lifter mechanism 89A and a pusher mechanism 90A. The top ring 92A is suspended from a top ring head 92A-1 by a top ring drive shaft 92A-2 capable of rotating. The top ring head 92A-1 is supported by a swing shaft 92A-3 capable of positioning the top ring head, and the top ring 92A is adapted to have access to the polishing tables 94A and 95A.

Further, the dresser 96A is suspended from a dresser head 94A-2 by a dresser drive shaft 94A-1 capable of rotating. The dresser head 94A-2 is supported by a swing shaft 94A-3 capable of positioning the dresser head, so that the dresser 96A can be moved between its stand-by position and a dresser position above the polishing table 94A. The dresser head (a swing arm) 97A-1 is supported by a swing shaft 97A-2 capable of positioning the dresser head, so that the dresser 97A can be moved between its stand-by position and a dresser position above the polishing table 95A. The dresser 97A has an elongated shape longer than a diameter of the table 95A, and the dresser head 97A-1 swings about the swing shaft 97A-2 as a center of swing motion.

The dresser 97A is suspended from the dresser head 97A-1 by a dresser fixing mechanism 99A in such a manner that owing to pivot motions of the swing shaft 97A-2 of the dresser head 97A-1, located oppositely dresser fixing mechanism 99A and the dresser 97A, the dresser 97A can make a motion resembling that of a wiper of a car to provide a dressing operation across the polishing table 95A without making rotational motion about its own axis. This embodiment has employed a scroll-polishing table for the polishing table 95A.

The lifter mechanism 89A and the pusher mechanism 90A are located below the linear transporter 87A. The turn-over machine 88A is located above the linear transporter 87A. In this arrangement, the top ring 92A can swing to position itself above the pusher mechanism 90A and the linear transporter 87A. The above-discussed top ring 92A, linear transporter 87A and pusher mechanism 90A have employed the top ring 10, the transporter T and the pusher mechanism 20, respectively, all of which have configurations as specified in FIG. 2.

Figure 3:
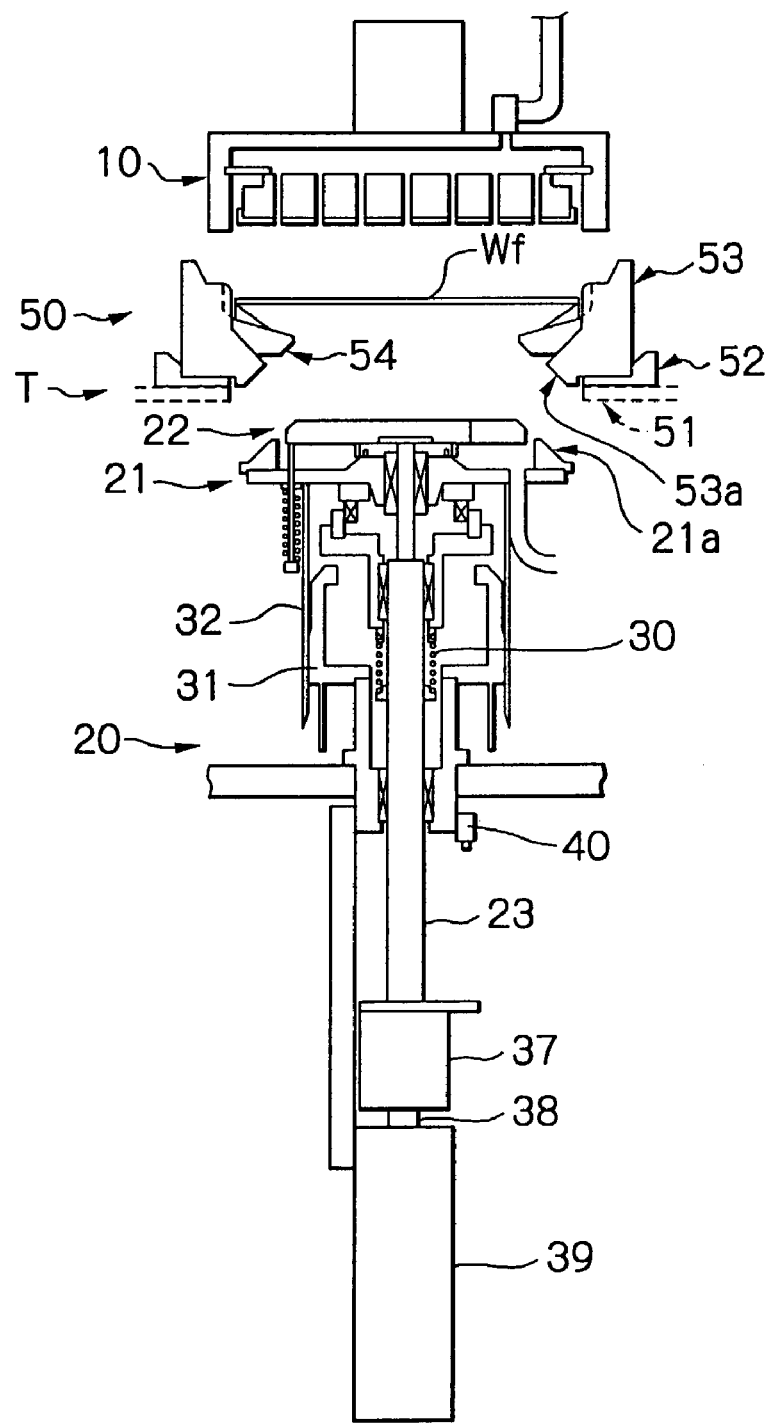
FIG. 3 is a schematic diagram for illustrating an operation of the substrate delivery mechanism according to the present invention.

The turn-over machine 88A receives a substrate from the transfer robot 80, and turns over that substrate in an upside down manner. Then, the substrate is transferred by the lifter mechanism 89A onto the substrate tray 54 accommodated in the top ring guide 53 positioned on the linear transporter 87A. In this condition, the linear transporter 87A moves from position "a" to position "b" shown in FIG. 14, and further the top ring 92A is positioned above the linear transporter 87A. This state is illustrated in FIG. 3. Starting from this state, the substrate Wf is transferred to the top ring 92A (the top ring 10) through operations shown in FIG. 3 to FIG. 6.

A transfer operation of the substrate Wf from the top ring 92A onto the substrate tray 54 accommodated in the top ring guide 53 positioned on the linear transporter 87A may be performed through operations shown in FIG. 7 to FIG. 10. Once the substrate Wf has been transferred onto the substrate tray 54, the linear transporter 87A is moved from position "b" to position "a" shown in FIG. 14. Then, the substrate is transferred by the lifter mechanism 89A to the turn-over machine 88A, where the substrate is turned-over and received by the transfer robot 80.

It is to be appreciated that a physical relationship among the top ring 92B, the polishing tables 94B and 95B, the linear transporter 87B, the lifter mechanism 89B and the pusher mechanism 90B is the same as that shown in FIG. 14.

A process flow in a substrate polishing apparatus having the above-discussed configuration will now be described in summary. In a two-cassette parallel processing with two stage cleaning, one substrate follows one process path from the substrate cassette (CS1)→the transfer robot 64→the substrate carrier table 67-1 of the substrate station 67→the transfer robot 80→the turn-over machine 88A→the loading stage in the linear transporter 87A→the top ring 92A→the polishing table 94A→the polishing table 95A (if necessary)→the unloading stage in the linear transporter 87A→the turn-over machine 88A→the transfer robot 80→the cleaning machine 82→the transfer robot 80→the cleaning machine 65→the transfer robot 64→the substrate cassette (CS1).

Similarly, another substrate follows another process path from the substrate cassette (CS2)→the transfer robot 64→the substrate carrier table 67-2 of the substrate station 67→the transfer robot 81→the turn-over machine 88B→the loading stage in the linear transporter 87B→the top ring 92B→the polishing table 94B→the polishing table 95B (if necessary)→the unloading stage in the linear transporter 87B→the turn-over machine 88B→the transfer robot 81→the cleaning machine 83→the transfer robot 81→the cleaning machine 66→the transfer robot 64→the substrate cassette (CS2).

Alternatively, for a two-cassette parallel processing with three stage cleaning, one substrate follows one process path from the substrate cassette (CS1)→the transfer robot 64→the substrate carrier table 67-1 of the substrate station 67→the transfer robot 80→the turn-over machine 88A→the loading stage in the linear transporter 87A→the top ring 92A→the polishing table 94A→the polishing table 95A (if necessary)→the unloading stage in the linear transporter 87A→the turn-over machine 88A→the transfer robot 80→the cleaning machine 82→the transfer robot 80→the carrier table 67-4 of the substrate station 67→the transfer robot 81→the cleaning machine 66→the transfer robot 81→the substrate carrier table 67-3 of the substrate station 67→the transfer robot 80→the cleaning machine 65→the transfer robot 64→the substrate cassette (CS1).

Similarly, another substrate follows another processing path from the substrate cassette (CS2)→the transfer robot 64→the substrate carrier table 67-2 of the substrate station 67→the transfer robot 80→the turn-over machine 88B→the loading stage in the linear transporter 87B→the top ring 92B→the polishing table 94B→the polishing table 95B (if necessary)→the unloading stage in the linear transporter 87B→the turn-over machine 88B→the transfer robot 81→the cleaning machine 83→the transfer robot 81→the cleaning machine 66→the transfer robot 81→the substrate carrier table 67-3 of the substrate station 67→the transfer robot 80→the cleaning machine 65→the transfer robot 64→the substrate cassette (CS2).

Furthermore, in a serial processing with three stage cleaning, a substrate follows a processing path from the substrate cassette (CS1)→the transfer robot 64→the substrate carrier table 67-1 of the substrate station 67→the transfer robot 80→the turn-over machine 88A→the loading stage in the linear transporter 87A→the top ring 92A→the polishing table 94A→the polishing table 95A (if necessary)→the unloading stage in the linear transporter 87A→the turn-over machine 88A→the transfer robot 80→the cleaning machine 82→the transfer robot 80→the substrate carrier table 67-4 of the substrate station 67→the transfer robot 81→the turn-over machine 88B→the loading stage in the linear transporter 87B→the top ring 92B→the polishing table 94B→the polishing table 95B (if necessary)→the unloading stage in the linear transporter 87B→the turn-over machine 88B→the transfer robot 81→the cleaning machine 83→the transfer robot 81→the cleaning machine 66→the transfer robot 81→the substrate carrier table 67-3 of the substrate station 67→the transfer robot 80→the cleaning machine 65→the transfer robot 64→the substrate cassette (CS1).

It is to be noted that the configuration of the polishing apparatus shown in FIG. 13 is presented by way of example, but a substrate polishing apparatus according to the present invention may have any suitable configuration so long as it employs a substrate delivery mechanism having the configuration shown in FIG. 2 for transfer of the substrate between the top ring and the transporter.

FIG. 15 is a schematic diagram showing another exemplary configuration for a substrate delivery mechanism according to the present invention. In this substrate delivery mechanism, as illustrated, a top ring guide 53 is fixed to a top ring guide lifting table 21, and a substrate loading table (a substrate lifting table) 55 is also fixed to a top end of a shaft 33. Further, reference numeral 56 designates a substrate carrier table of a linear transporter (a substrate transfer mechanism) T, which carries substrate Wf thereon and transfers that substrate from a substrate delivery position of the substrate delivery mechanism to another substrate transfer mechanism, and from another substrate transfer mechanism to the substrate delivery position. The substrate loading table 55 has a chamber 55a formed inside thereof, and a top surface thereof defines a substrate carrier surface (a substrate contact surface) which is provided with a plurality of through-holes 55b in communication with the chamber 55a.

Further, the substrate loading table 55 is connected with a pipe 57 in communication with the chamber 55a. The pipe 57 is connected to a vacuum pumping source and a fluid supply source via a change-over valve, though not shown, which may be changed over to thereby exhaust a fluid in the chamber 55a or supply a fluid (a gas, a liquid or a mixture thereof) into the chamber 55a. An operation of the substrate polishing apparatus shown in FIG. 15 will now be described with reference to FIG. 16 to FIG. 21.

A moving up and down operation of the top ring guide lifting table 21 as well as a moving up and down operation of the substrate loading table 55 are almost the same as that of the top ring guide lifting table 21 and that of the substrate tray lifting table 22, respectively, in the substrate delivery mechanism shown in FIG. 2. FIG. 16 shows a state after polishing of a substrate Wf, in which the substrate Wf held by a substrate holding plate 12 of a top ring 10 is in a stand-by position above a delivery point.

Before that, it is to be appreciated that when a substrate carried on the wafer carrier table 56 of the linear transporter T as shown in FIG. 15 is to be transferred to and held on the substrate holding plate 12 of the top ring 10, first, the top ring guide 53 is moved up with aid of a moving-up motion of a cylinder 39 so as to mate the top ring guide with a bottom end of the top ring 10. Then, the substrate Wf on the substrate carrier table 56 of the linear transporter T is further pushed up by the substrate loading table 55 with aid of a moving-up motion of a cylinder 37 so as to bring the substrate into contact with a substrate holding surface of the substrate holding plate 12 of the top ring 10. Then, a chamber 14 of the top ring 10 is evacuated to vacuum-chuck the substrate 12 onto the substrate holding surface of the substrate holding plate 12, as shown in FIG. 18.

Returning now to the description of the operation mentioned above, first of all, starting from a state shown in FIG. 16, the top ring guide lifting table 21 and the top ring guide 53 are moved up with aid of the moving-up motion of the cylinder 39 to thereby bring the top ring guide 53 into contact with the bottom end of the top ring 10, as shown in FIG. 17, and further moved up until the moving-up motion is stopped by actuation of an upper limit end stopper 40, as shown in FIG. 18, whereupon the top ring guide 53 is mated with the bottom end of the top ring 10 thus to position the top ring 10 (centering operation). In this condition, the cylinder 37 is activated to make a moving-up motion to thereby move up a shaft 33, so that a substrate holding surface of the substrate loading table 55 may come into contact with an under surface of the substrate Wf held on the substrate holding plate 12 of the top ring 10, as shown in FIG. 18.

In this condition, as shown in FIG. 19, fluid is supplied into the chamber 14 of the top ring 10 through the pipe 15 and injected from the through-holes 12b of the substrate holding plate 12 over the substrate holding surface, while at the same time the pipe 57 is made to communicate with the vacuum pumping source via a change-over valve (not shown) so as to evacuate the chamber 55a and thereby allow negative pressure to be applied onto the substrate Wf via through-holes 55b, so that the substrate Wf is resultantly vacuum-chucked on the substrate holding surface of the substrate loading table 55, as shown in FIG. 20. Then, the cylinder 39 is activated to make a moving-down motion, whereby the substrate Wf is detached immediately from the substrate holding plate 12 of the top ring 10 and vacuum-chucked and held on the substrate loading table 55 of the pusher mechanism 20.

In this case also, similarly to the substrate delivery mechanism shown in FIG. 2, especially in such a case where fluid is supplied into the chamber 14 of the top ring 10, and thus generated fluid pressure is used to press the substrate Wf via the elastic membrane 12a made of rubber or the like against the polishing surface of the polishing table so as to polish a surface of the substrate Wf, when the fluid is injected from the through-holes 12b in an attempt to detach the substrate Wf from the substrate holding surface of the substrate holding plate 12 of the top ring 10 after a polishing operation has been completed, even if the substrate Wf is pushed away by a certain distance from the under surface of the substrate holding plate 12 of the top ring 10, the elastic membrane 12a is likely to deform and remain adhered to the substrate Wf, and accordingly, a longer time is required to detach the substrate Wf completely. However, in the above described method, since the chamber 55a in the substrate loading table 55 is evacuated to apply a negative pressure to the substrate Wf through the through-holes 55b, and further since the cylinder 37 is activated to make the moving-down motion, the substrate Wf is allowed to be detached easily.

After the substrate Wf has been detached from the substrate holding surface of the substrate holding plate 12 of the top ring 10 and vacuum-chucked and held on the substrate carrier surface (the substrate contact surface) of the substrate loading table 55, the substrate loading table 55 and the top ring guide 53 are moved down by a predetermined distance with aid of a moving-down motion of the cylinder 39, as shown in FIG. 21, and then the pipe 57 is made to communicate with a positively pressurized fluid source via the change-over valve (not shown) to thereby introduce positive pressure into the chamber 55a of the substrate loading table 55, so that the substrate Wf can be now released from a vacuum-chucked condition and detached easily from the top surface of the substrate loading table 55. In this condition, the cylinder 39 is further moved down, and thereby the substrate Wf is placed on the substrate carrier table of the linear transporter T, and the substrate loading table 55 and the top ring guide 53 are also moved down and stopped at predetermined positions, as shown in FIG. 15.

FIG. 23 is a partially cutaway top view of a substrate loading table 55 representing another example of the substrate loading table of the substrate delivery mechanism shown in FIG. 15. The substrate loading table 55 shown in FIG. 23 has a chamber 55a-1 serving to vacuum-chuck substrate Wf and another chamber 55a-2 which will be filled with positively pressurized fluid to release the substrate Wf from a vacuum-chucked condition, which has been received by the substrate loading table 55 and held thereon, and respective chambers 55a-1 and 55a-2 are provided with a plurality of through-holes 55b-1 and 55b-2 in order to apply a fluid of negative or positive pressure onto the substrate, and further, the respective chambers 55a-1 and 55a-2 are in communication with pipes 57a and 57b, which are connected to a vacuum source or a positively pressurized fluid source via valves (not shown), respectively.

Further, as shown in FIG. 22, the substrate delivery mechanism is provided with nozzles 58 and 58 for spraying a surfactant, so that the surfactant may be sprayed across a substrate holding surface of the substrate holding plate 12 of the top ring 10 before holding the substrate Wf, or a top ring side surface of the substrate Wf, or both surfaces. This can facilitate a detaching operation of the substrate Wf from the substrate holding surface of the substrate holding plate 12.

It is to be noted that when the substrate Wf is to be detached from the substrate holding plate 12 of the top ring 10 (see FIG. 19), the surfactant may be supplied through the pipe 15 prior to supply of fluid into the chamber 14 via the pipe 15 to apply positive pressure to the surface of the substrate Wf, which has been in contact with the substrate holding plate 12.

It is a matter of course that a substrate delivery unit having a configuration specified in FIG. 15 may be employed to build up a substrate polishing apparatus having a configuration shown in FIG. 13, which can take advantage of those features pertaining to that substrate delivery unit.

As discussed above, according to the present invention as defined in respective claims, the following effects are expected to be brought about.

According to the inventions of the first to fourth aspects, since when the substrate is to be transferred from the substrate holder of the substrate holder mechanism to the substrate loader of the pusher mechanism, the substrate holder side of the substrate is put under positive pressure (by, for example, injecting a positively pressurized fluid consisting of a gas, a liquid or a mixture thereof) and the substrate loader side of the substrate is put under negative pressure (by, for example, connecting this region to the vacuum source for evacuation), the substrate can be quickly detached from the substrate holder of the substrate holder mechanism so as to be transferred to the substrate loader of the pusher mechanism by cooperative action of these positive and negative pressures.

According to the invention of the third aspect, since after the substrate loader of the pusher mechanism has received the substrate, positive pressure is applied through the through-holes formed in the substrate contact surface of the substrate loader (by, for example, injecting a positively pressurized fluid consisting of a gas, a liquid or a mixture thereof), the substrate can be released from its state of being chucked onto the substrate loader by negative pressure, so that the substrate can be easily detached from the substrate loader.

According to the invention of the fifth aspect, since the surfactant is sprayed over the substrate contact surface of the substrate holder of the substrate holder mechanism and/or the substrate holder side surface of the substrate, the substrate having been vacuum-chucked and held on the substrate holder of the substrate holder mechanism can be easily detached.

According to the invention of the sixth aspect, since the surfactant is sprayed over the substrate contact surface of the substrate holder of the substrate holder mechanism and/or the substrate holder side surface of the substrate, the substrate having been vacuum-chucked and held on the substrate holder of the substrate holder mechanism can be easily detached therefrom.

According to the invention of the seventh aspect, since the transfer operation of the substrate, held in the substrate holder of the substrate holder mechanism, to the substrate loader of the pusher mechanism is performed by exhausting a sealed space formed below the substrate, the substrate can be quickly detached from the substrate holder of the substrate holder mechanism so as to be transferred to the substrate loader.

According to the invention of the eighth aspect, the substrate holder mechanism guide and the substrate holder mechanism guide lifting table form a sealed space below the substrate held by the substrate holder of the substrate holder mechanism in a condition where the substrate loader has been lifted up by the pusher mechanism, and the exhausting mechanism is additionally provided for exhausting the sealed space. Therefore, when the substrate held on the substrate holder of the substrate holder mechanism is to be detached therefrom, the substrate can be quickly detached from the substrate holder so as to be transferred to the substrate loader by exhausting this sealed air-tight space to be in a negative pressure state, thereby creating a lower pressure therein than that above the substrate.

According to the invention of the ninth aspect, since the transfer operation of the substrate, held by the substrate holder of the substrate holder mechanism, to the substrate loader is performed by cooperative action of positive pressure, created by the fluid injection mechanism by injecting fluid from the through-holes formed in the substrate contact surface of the substrate holder of the substrate holder mechanism, and negative pressure created by the exhaust mechanism by exhausting the sealed space defined below the substrate, the substrate can be quickly detached from the substrate holder of the substrate holder mechanism so as to be transferred onto the substrate loader.

According to the invention of the tenth aspect, the transfer operation of the substrate loaded on the substrate tray to the substrate holder mechanism is performed, in a condition where the substrate loader has been moved up by the pusher mechanism, by further lifting up the substrate tray with aid of the substrate tray lifting table; therefore, the substrate can be transferred quickly to the substrate holder of the substrate holder mechanism.

According to the invention of the eleventh aspect, since the substrate is transferred from the substrate holder to the substrate lifting table with aid of fluid injection from the substrate holder of the substrate holder mechanism together with the vacuum suction by the vacuum source in communication with the through-holes formed in the substrate contact surface of the substrate lifting table, the transfer operation of the substrate from the substrate holder to the substrate lifting table can be performed quickly.

According to the invention of the twelfth aspect, the through-holes formed in the substrate contact surface of the substrate lifting table are designed to be connected to, in addition to the vacuum source, the positively pressurized fluid source; therefore, the substrate, once vacuum-chucked, can be released from that vacuum-chucked state easily and completely, and thus the substrate can be detached from the substrate lifting table.

According to the invention of the thirteenth aspect, since the substrate transfer mechanism is further provided, the transfer operation of the substrate, placed on the substrate carrier in the substrate delivery position of the substrate delivery mechanism, to other transfer mechanisms as well as the transfer of the substrate placed on the substrate carrier in the other transfer mechanisms to the substrate delivery position of the substrate delivery mechanism can be performed easily.

According to the invention of the fourteenth aspect, since the nozzle for spraying the surfactant is further provided so that the surfactant may be sprayed from the nozzle over the substrate contact surface of the substrate holder of the substrate holder mechanism before holding the substrate and/or the substrate holder side surface of the substrate, the substrate held by the substrate holder of the substrate retainer mechanism can be easily detached therefrom.

According to the invention of the fifteenth aspect, since the substrate polishing apparatus comprises the substrate delivery mechanism of any one of the eighth to fourteenth aspects, the substrate can be quickly transferred to or received from the substrate holder of the substrate holder mechanism, thereby improving a polishing process rate in the substrate polishing apparatus.

What is claimed is:

1. A substrate delivery mechanism comprising:
    a holder for holding a substrate;
    a loader for transferring the substrate to said holder or receiving the substrate from said holder; and
    a pusher mechanism having
        (i) a lifting table for lifting said loader so as to be fitted with an outer periphery of said holder when said loader is to transfer the substrate to said holder or receive the substrate from said holder, and
        (ii) an exhaust pipe connected to said lifting table,
    wherein said exhaust pipe is to exhaust a sealed space defined by an under surface of said holder, an inner surface of said loader and a top surface of said lifting table after said lifting table has lifted said loader so as to be fitted with the outer periphery of said holder.

2. The substrate delivery mechanism according to claim 1, wherein
    said holder includes a fluid injection mechanism for injecting a fluid consisting of a gas, a liquid, or a mixture thereof, through through-holes formed in a substrate contact surface of said holder after said lifting table has lifted said loader so as to be fitted with the outer periphery of said holder.

3. The substrate delivery mechanism according to claim 2, further comprising:
    a substrate transfer mechanism including a substrate carrier on which the substrate is to be placed, said substrate carrier being movable between a substrate delivery position of said substrate delivery mechanism and another transfer mechanism so as to transfer the substrate.

4. The substrate delivery mechanism according to claim 3, further comprising:
    a nozzle for spraying a surfactant over the substrate contact surface of said holder and/or a substrate-holder-side surface of the substrate.

5. The substrate delivery mechanism according to claim 1, further comprising:
    a substrate transfer mechanism including a substrate carrier on which the substrate is to be placed, said substrate carrier being movable between a substrate delivery position of said substrate delivery mechanism and another transfer mechanism so as to transfer the substrate.

6. The substrate delivery mechanism according to claim 5, further comprising:
    a nozzle for spraying a surfactant over a substrate contact surface of said holder and/or a substrate-holder-side surface of the substrate.

7. The substrate delivery mechanism according to claim 1, further comprising:
    a nozzle for spraying a surfactant over a substrate contact surface of said holder and/or a substrate-holder-side surface of the substrate.

8. A substrate delivery mechanism comprising:
    a holder for holding a substrate;

a lifting table capable of being brought into contact with said holder when transferring the substrate to said holder or receiving the substrate from said holder; and a pipe connected to said lifting table, wherein said pipe is communicable with a vacuum source such that after said lifting table is brought into contact with said holder, when the substrate is to be transferred from said holder to said lifting table and with said pipe being in communication with the vacuum source, suction can be applied via said pipe to a lower surface of the substrate while a fluid is injected from said holder against an upper surface of the substrate.

9. The substrate delivery mechanism according to claim 8, wherein said pipe is designed to be connected to the vacuum source and to a positively pressurized fluid source.

10. The substrate delivery mechanism according to claim 9, wherein said holder includes an elastic membrane, as a substrate holding surface, for pressing the substrate against a polishing surface via fluid pressure applied to said elastic membrane.

11. The substrate delivery mechanism according to claim 10, further comprising:

a substrate transfer mechanism including a substrate carrier on which the substrate is to be placed, said substrate carrier being movable between a substrate delivery position of said substrate delivery mechanism and another transfer mechanism so as to transfer the substrate.

12. The substrate delivery mechanism according to claim 11, further comprising:

a nozzle for spraying a surfactant over said substrate holding surface and/or a substrate holder-side-surface of the substrate.

13. The substrate delivery mechanism according to claim 10, further comprising:

a nozzle for spraying a surfactant over said substrate holding surface and/or a substrate-holder-side surface of the substrate.

14. The substrate delivery mechanism according to claim 9, further comprising:

a substrate transfer mechanism including a substrate carrier on which the substrate is to be placed, said substrate carrier being movable between a substrate delivery position of said substrate delivery mechanism and another transfer mechanism so as to transfer the substrate.

15. The substrate delivery mechanism according to claim 14, further comprising:

a nozzle for spraying a surfactant over a substrate contact surface of said holder and/or a substrate-holder-side surface of the substrate.

16. The substrate delivery mechanism according to claim 9, further comprising:

a nozzle for spraying a surfactant over a substrate contact surface of said holder and/or a substrate-holder-side surface of the substrate.

17. The substrate delivery mechanism according to claim 8, wherein said holder includes an elastic membrane, as a substrate holding surface, for pressing the substrate against a polishing surface via fluid pressure applied to said elastic membrane.

18. The substrate delivery mechanism according to claim 17, further comprising:

a substrate transfer mechanism including a substrate carrier on which the substrate is to be placed, said substrate carrier being movable between a substrate delivery position of said substrate delivery mechanism and another transfer mechanism so as to transfer the substrate.

19. The substrate delivery mechanism according to claim 18, further comprising:

a nozzle for spraying a surfactant over said substrate holding surface and/or a substrate-holder-side surface of the substrate.

20. The substrate delivery mechanism according to claim 17, further comprising:

a nozzle for spraying a surfactant over said substrate holding surface and/or a substrate-holder-side surface of the substrate.

21. The substrate delivery mechanism according to claim 8, further comprising:

a substrate transfer mechanism including a substrate carrier on which the substrate is to be placed, said substrate carrier being movable between a substrate delivery position of said substrate delivery mechanism and another transfer mechanism so as to transfer the substrate.

22. The substrate delivery mechanism according to claim 8, further comprising:

a nozzle for spraying a surfactant over a substrate contact surface of said holder and/or a substrate-holder-side surface of the substrate.

* * * * *